(12) United States Patent
Kim et al.

(10) Patent No.: US 12,080,767 B2
(45) Date of Patent: Sep. 3, 2024

(54) SEMICONDUCTOR DEVICE INCLUDING PASSIVATION PATTERNS

(71) Applicant: SAMSUNG ELECTRONICS CO., LTD., Suwon-si (KR)

(72) Inventors: Sung Soo Kim, Hwaseong-si (KR); Joohan Kim, Seoul (KR); Gyuhwan Ahn, Gunpo-si (KR); Ik Soo Kim, Yongin-si (KR); Jongmin Baek, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 485 days.

(21) Appl. No.: 17/406,310

(22) Filed: Aug. 19, 2021

(65) Prior Publication Data

US 2022/0199789 A1  Jun. 23, 2022

(30) Foreign Application Priority Data

Dec. 23, 2020 (KR) .......................... 10-2020-0182042

(51) Int. Cl.
| | |
|---|---|
| H01L 29/41 | (2006.01) |
| H01L 29/417 | (2006.01) |
| H01L 29/423 | (2006.01) |
| H01L 29/78 | (2006.01) |
| H01L 29/786 | (2006.01) |

(52) U.S. Cl.
CPC .. H01L 29/41775 (2013.01); H01L 29/42392 (2013.01); H01L 29/78696 (2013.01); *H01L 29/7851* (2013.01); *H01L 29/7853* (2013.01)

(58) Field of Classification Search
CPC ......... H01L 29/41775; H01L 29/42392; H01L 29/42376; H01L 29/165; H01L 29/7848; H01L 29/0673; H01L 29/0847; H01L 29/775; H01L 29/092; H01L 29/7851; H01L 29/7853
See application file for complete search history.

(56) References Cited

U.S. PATENT DOCUMENTS

| | | | | | |
|---|---|---|---|---|---|
| 6,110,792 | A | * | 8/2000 | Bronner ............... | H10B 12/038 |
| | | | | | 257/E21.651 |
| 6,121,651 | A | * | 9/2000 | Furukawa ............ | H10B 12/488 |
| | | | | | 257/E27.092 |
| 6,144,054 | A | * | 11/2000 | Agahi ................ | H10B 12/0383 |
| | | | | | 257/302 |

(Continued)

*Primary Examiner* — Ida M Soward
(74) *Attorney, Agent, or Firm* — F. Chau & Associates, LLC

(57) ABSTRACT

A semiconductor device includes a first active pattern disposed on a substrate, a device isolation layer filling a trench that defines the first active pattern, a first channel pattern and a first source/drain pattern disposed on the first active pattern in which the first channel pattern includes semiconductor patterns stacked and spaced apart from each other, a gate electrode that extends and runs across the first channel pattern, a gate dielectric layer disposed between the first channel pattern and the gate electrode, and a first passivation pattern disposed between the device isolation layer and a first sidewall of the first active pattern. The first passivation pattern includes an upper part that protrudes upwardly from the device isolation layer, and a lower part buried in the device isolation layer. The gate dielectric layer covers the upper part of the first passivation pattern.

20 Claims, 40 Drawing Sheets

(56) References Cited

U.S. PATENT DOCUMENTS

| | | | |
|---|---|---|---|
| 6,489,646 B1* | 12/2002 | Jang | H10B 12/37 |
| | | | 257/E21.396 |
| 6,835,981 B2* | 12/2004 | Yamada | H10B 12/09 |
| | | | 257/E21.651 |
| 9,093,299 B1 | 7/2015 | Liu et al. | |
| 9,209,243 B2 | 12/2015 | Chuang et al. | |
| 9,455,198 B1* | 9/2016 | Yu | H01L 29/66 |
| 9,620,407 B2 | 4/2017 | Godet et al. | |
| 10,205,020 B2* | 2/2019 | Lee | H01L 29/0649 |
| 10,332,961 B2 | 6/2019 | Cheng et al. | |
| 10,720,508 B2 | 7/2020 | Le et al. | |
| 2017/0213904 A1* | 7/2017 | Na | H01L 29/7787 |
| 2018/0083007 A1* | 3/2018 | Lee | H01L 27/092 |
| 2018/0374926 A1* | 12/2018 | Lee | H01L 21/823842 |
| 2019/0043761 A1* | 2/2019 | Min | H01L 27/0924 |
| 2019/0181225 A1* | 6/2019 | Lee | H01L 21/823814 |
| 2020/0013898 A1* | 1/2020 | Yim | H01L 21/823857 |
| 2020/0035705 A1* | 1/2020 | Kim | H01L 29/42392 |
| 2020/0194565 A1* | 6/2020 | Chung | B82Y 10/00 |
| 2020/0243665 A1 | 7/2020 | Ching et al. | |
| 2020/0273753 A1 | 8/2020 | Loubet et al. | |
| 2020/0343378 A1* | 10/2020 | Jeong | H01L 29/0653 |
| 2020/0381311 A1* | 12/2020 | Kim | H01L 21/28088 |

\* cited by examiner

SEMICONDUCTOR DEVICE INCLUDING PASSIVATION PATTERNS

CROSS-REFERENCE TO RELATED APPLICATIONS

This U.S. nonprovisional application claims priority under 35 U.S.C § 119 to Korean Patent Application No. 10-2020-0182042, filed on Dec. 23, 2020 in the Korean Intellectual Property Office, the disclosure of which is hereby incorporated by reference in its entirety.

TECHNICAL FIELD

Embodiments of the present inventive concept relate to a semiconductor device and a method of fabricating the same, and more particularly, to a semiconductor device including a field effect transistor and a method of fabricating the same.

DISCUSSION OF RELATED ART

A semiconductor device may include an integrated circuit including metal oxide semiconductor field effect transistors (MOSFETs). As sizes and design rules of semiconductor device are gradually decreased, sizes of the MOSFETs are also increasingly scaled down. The scaling down of MOSFETs may deteriorate operating characteristics of the semiconductor device.

SUMMARY

Some embodiments of the present inventive concept provide a semiconductor device having increased reliability and improved electrical characteristics.

Some embodiments of the present inventive concept provide a method of fabricating a semiconductor device having increased reliability and improved electrical characteristics.

According to some embodiments of the present inventive concept, a semiconductor device includes a first active pattern disposed on a substrate, a device isolation layer that fills a trench which defines the first active pattern, a first channel pattern and a first source/drain pattern disposed on the first active pattern, the first channel pattern including a plurality of semiconductor patterns that are stacked and spaced apart from each other, a gate electrode that extends and runs across the first channel pattern, a gate dielectric layer disposed between the first channel pattern and the gate electrode, and a first passivation pattern disposed between the device isolation layer and a first sidewall of the first active pattern. The first passivation pattern includes an upper part that protrudes upwardly from the device isolation layer and a lower part that is buried in the device isolation layer. The gate dielectric layer covers the upper part of the first passivation pattern.

According to some embodiments of the present inventive concept, a semiconductor device includes a first active pattern disposed on a substrate, a device isolation layer that fills a trench which defines the first active pattern, a first channel pattern and a first source/drain pattern disposed on the first active pattern, the first channel pattern including a plurality of semiconductor patterns that are stacked and spaced apart from each other, a gate electrode that extends and runs across the first channel pattern, a gate dielectric layer disposed between the first channel pattern and the gate electrode, a first passivation pattern disposed between the device isolation layer and a first sidewall of the first active pattern, and a second passivation pattern disposed between the device isolation layer and a second sidewall of the first active pattern, the second sidewall being opposite to the first sidewall. A size of the first passivation pattern is different from a size of the second passivation pattern.

According to some embodiments of the present inventive concept, a semiconductor device includes a first active pattern disposed on a substrate, a device isolation layer that fills a trench which defines the first active pattern, and a first passivation pattern disposed between the device isolation layer and a first sidewall of the first active pattern. The semiconductor device further includes a first source/drain pattern disposed on the first active pattern and a first channel pattern connected to the first source/drain pattern, the first channel pattern including a first semiconductor pattern, a second semiconductor pattern, and a third semiconductor pattern that are sequentially stacked and spaced apart from each other. The semiconductor device further includes a gate electrode that runs across the first channel pattern and extends in a first direction, the gate electrode including a first part disposed between the first active pattern and the first semiconductor pattern, a second part disposed between the first semiconductor pattern and the second semiconductor pattern, a third part disposed between the second semiconductor pattern and the third semiconductor pattern, and a fourth part disposed on the third semiconductor pattern. The semiconductor device further includes a gate dielectric layer disposed between the first channel pattern and the gate electrode, a plurality of gate spacers disposed on opposite sidewalls of the fourth part of the gate electrode, a gate capping pattern disposed on a top surface of the gate electrode, a first interlayer dielectric layer disposed on the gate capping pattern, an active contact that penetrates the first interlayer dielectric layer and is coupled to the first source/drain pattern, and a gate contact that penetrates the first interlayer dielectric layer and is coupled to the gate electrode. The semiconductor device further includes a second interlayer dielectric layer disposed on the first interlayer dielectric layer, a first metal layer disposed in the second interlayer dielectric layer, the first metal layer including a plurality of first lines electrically connected to the active contact and the gate contact, a third interlayer dielectric layer disposed on the second interlayer dielectric layer, and a second metal layer disposed in the third interlayer dielectric layer. The second metal layer includes a plurality of second lines electrically connected to corresponding first lines among the plurality of first lines. The first passivation pattern includes an upper part that protrudes upwardly from the device isolation layer, and a lower part that is buried in the device isolation layer. The gate dielectric layer covers the upper part of the first passivation pattern.

According to some embodiments of the present inventive concept, a method of fabricating a semiconductor device includes alternately stacking a plurality of sacrificial layers and a plurality of active layers on a substrate, and forming a trench that defines an active pattern and a stack pattern on the active pattern by performing, on the substrate, a patterning process. The stack pattern includes the sacrificial layers and the active layers. The method further includes selectively forming a passivation layer on the stack pattern, forming a device isolation layer that fills the trench and covers the stack pattern, exposing the stack pattern by recessing the device isolation layer and removing the passivation layer, in which at least a portion of the passivation layer remains and forms a passivation pattern, forming a source/drain pattern on the active pattern, and replacing the sacrificial layers of the stack pattern with a gate electrode.

BRIEF DESCRIPTION OF THE DRAWINGS

The above and other features of the present inventive concept will become more apparent by describing in detail embodiments thereof with reference to the accompanying drawings, in which.

DETAILED DESCRIPTION OF EMBODIMENTS

Figure 1:
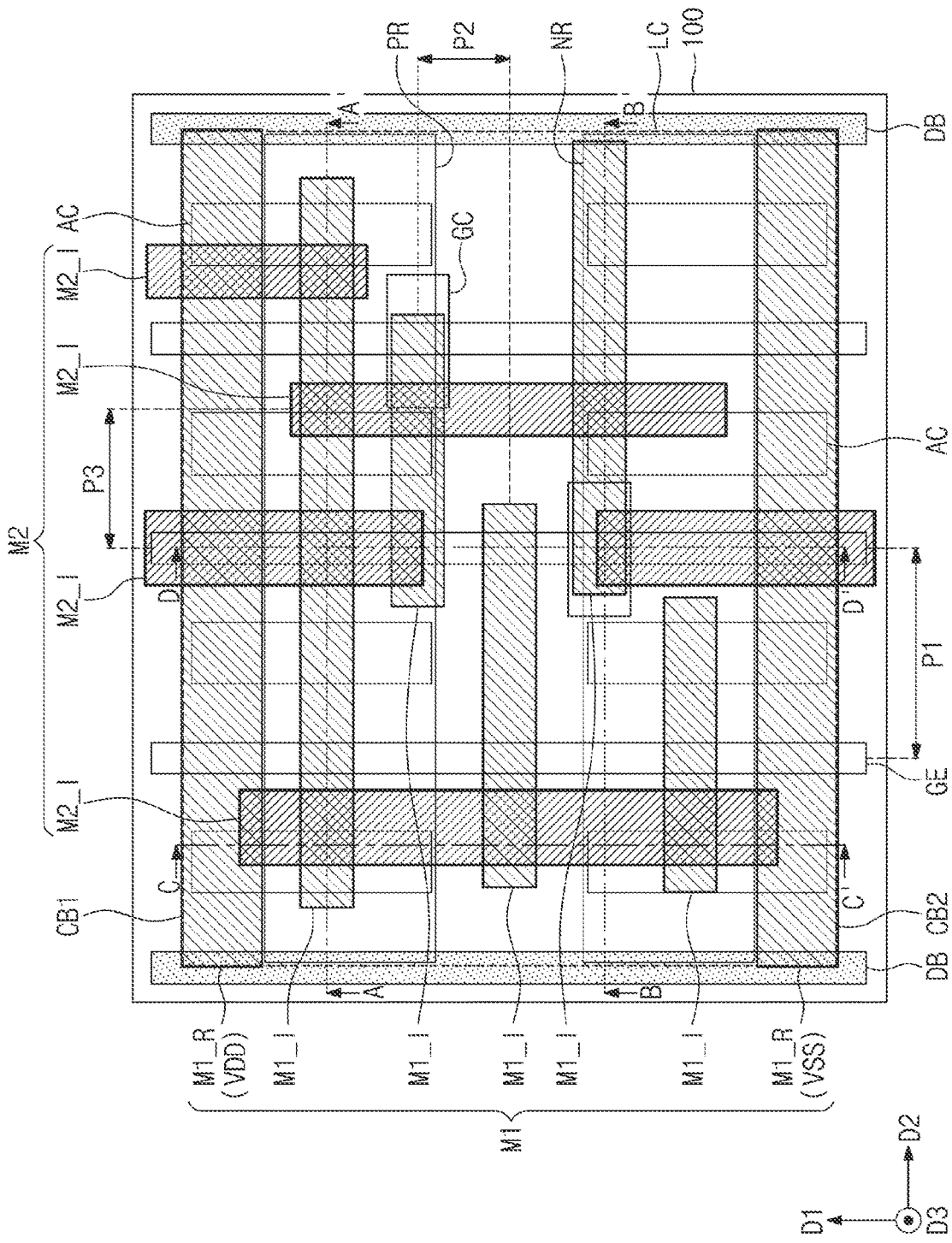
FIG. 1 illustrates a plan view showing a semiconductor device according to some embodiments of the present inventive concept.

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when elements are described as being substantially coplanar with one another, it is to be understood that elements are exactly coplanar with one another, or almost coplanar with one another (e.g., within a measurement error), as would be understood by a person having ordinary skill in the art. Further, when one value is described as being about the same as or about equal to another value, or substantially the same as or substantially equal to another value, it is to be understood that the values are equal to each other or within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Figure 2A:
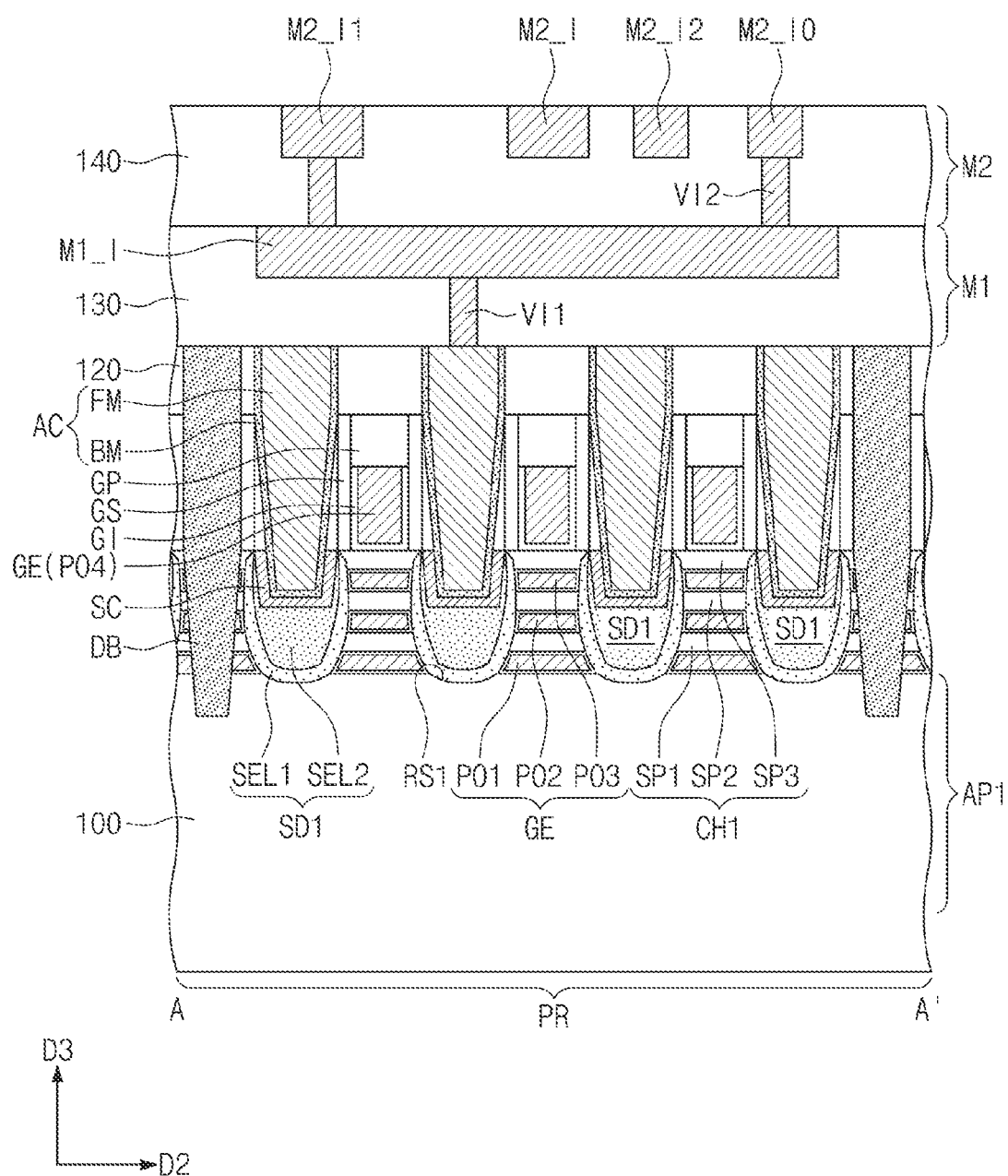
FIGS. 2A, 2B, 2C, and 2D illustrate cross-sectional views respectively taken along lines A-A', B-B', C-C', and D-D' of FIG. 1.
Figure 2B:
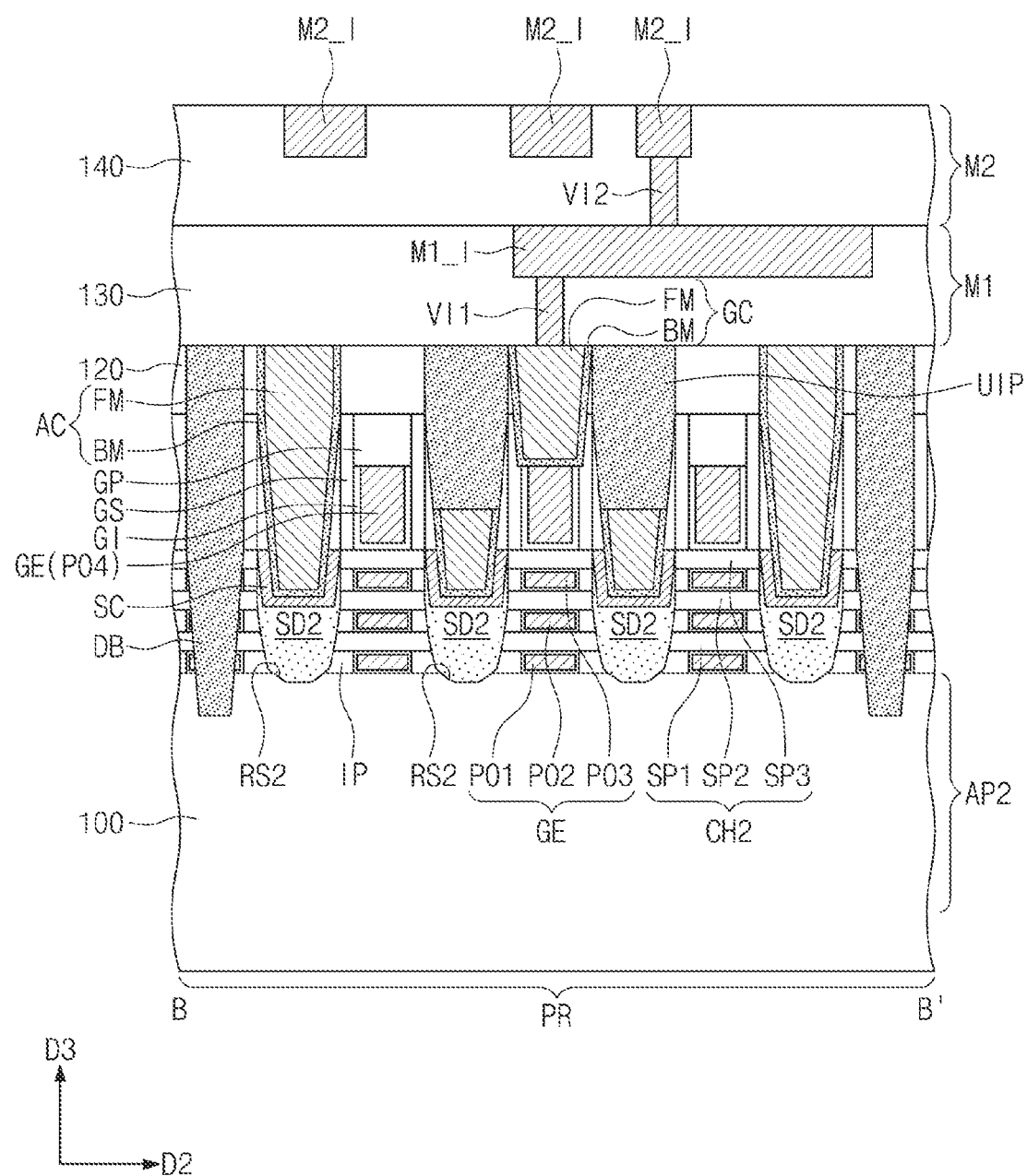

FIG. 1 illustrates a plan view showing a semiconductor device according to some embodiments of the present inventive concept. FIGS. 2A, 2B, 2C, and 2D illustrate cross-sectional views respectively taken along lines A-A', B-B', C-C', and D-D' of FIG. 1. FIG. 3 illustrates an enlarged cross-sectional view showing section M of FIG. 2D.

Referring to FIGS. 1 and 2A to 2D, a logic cell LC may be provided on a substrate 100. The logic cell LC may include logic transistors that constitute a logic circuit. The substrate 100 may be a compound semiconductor substrate or a semiconductor substrate including, for example, silicon, germanium, or silicon-germanium. For example, the substrate 100 may be a silicon substrate. The logic cell LC may include a p-type metal-oxide-semiconductor field-effect transistor (PMOSFET) region PR and an n-type metal-oxide-semiconductor field-effect transistor (NMOSFET) region NR. The PMOSFET region PR and the NMOSFET region NR may be spaced apart from each other in a first direction D1.

A first active pattern AP1 and a second active pattern AP2 may be defined by a trench TR formed on an upper portion of a substrate 100. The first active pattern AP1 and the second active pattern AP2 may be respectively provided on the PMOSFET region PR and the NMOSFET region NR. The first and second active patterns AP1 and AP2 may extend in a second direction D2. The first and second active patterns AP1 and AP2 may be vertically protruding portions of the substrate 100.

The trench TR may be filled with a device isolation layer ST. The device isolation layer ST may include a silicon oxide layer. The device isolation layer ST may cover none of first and second channel patterns CH1 and CH2, which will be described below.

A liner layer OLI may be interposed between the device isolation layer ST and the first and second active patterns AP1 and AP2. The liner layer OLI may directly contact and cover a sidewall of each of the first and second active patterns AP1 and AP2. For example, the liner layer OLI may directly contact and cover a sidewall of the trench TR. The liner layer OLI may directly contact and cover a bottom surface of the trench TR. For example, the liner layer OLI may include a silicon oxide layer. In an embodiment of the present inventive concept, the liner layer OLI may include the same material as that of the device isolation layer ST, and in this case, no boundary may appear between the liner layer OLI and the device isolation layer ST.

A passivation pattern NLP may be interposed between the device isolation layer ST and an upper sidewall of each of the first and second active patterns AP1 and AP2. The passivation pattern NLP may be interposed between the liner layer OLI and the device isolation layer ST. The passivation pattern NLP may be adjacent to the upper sidewall of each of the first and second active patterns AP1 and AP2, but not adjacent to a lower sidewall of each of the first and second active patterns AP1 and AP2. The passivation pattern NLP may include, for example, SiOC, SiN, SiC, AlO, $TiO_2$, or a combination thereof. For example, the passivation pattern NLP may include SiN. A further detailed description of the passivation pattern NLP will be described below with reference to FIG. 3.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (e.g., a third direction D3).

Each of the first, second, and third semiconductor patterns SP1, SP2, and SP3 may include, for example, silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 may be provided on the first active pattern AP1. A plurality of first recessions RS1 may be formed on an upper portion of the first active pattern AP1. A plurality of first source/drain patterns SD1 may be provided in corresponding first recessions RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the first, second, and third semiconductor patterns SP1, SP2, and SP3 that are stacked and spaced apart from each other.

A plurality of second source/drain patterns SD2 may be provided on the second active pattern AP2. A plurality of second recessions RS2 may be formed on an upper portion of the second active pattern AP2. A plurality of second source/drain patterns SD2 may be provided in corresponding second recessions RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the first, second, and third semiconductor patterns SP1 to SP3 that are stacked.

The first and second source/drain patterns SD1 and SD2 may be epitaxial patterns formed by a selective epitaxial growth process. In an embodiment, each of the first and second source/drain patterns SD1 and SD2 may have a top surface at a level substantially the same as that of a top surface of the third semiconductor pattern SP3. In an embodiment, each of the first and second source/drain patterns SD1 and SD2 may have a top surface at a level higher than that of a top surface of the third semiconductor pattern SP3.

Figure 2C:
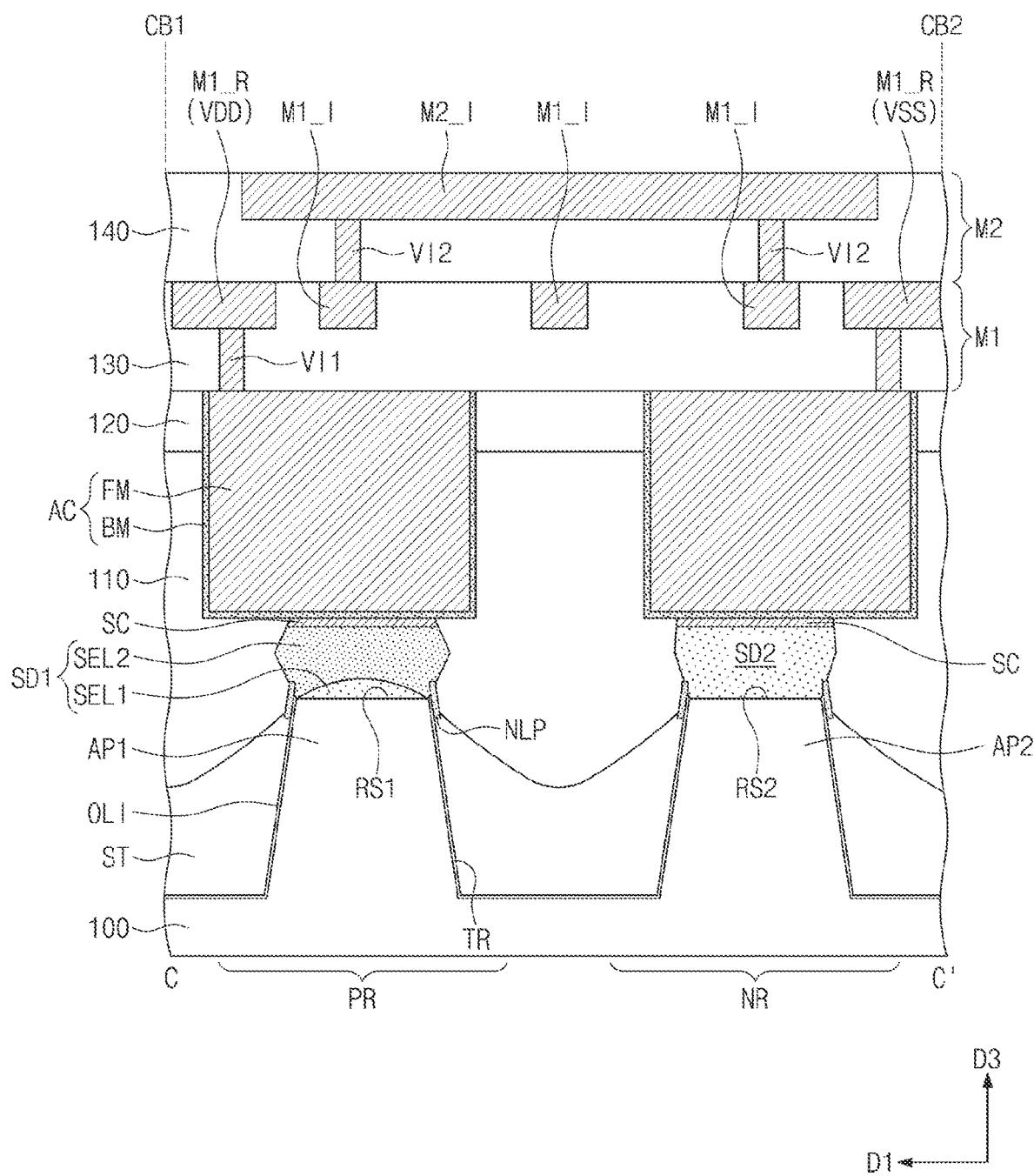
Figure 3:
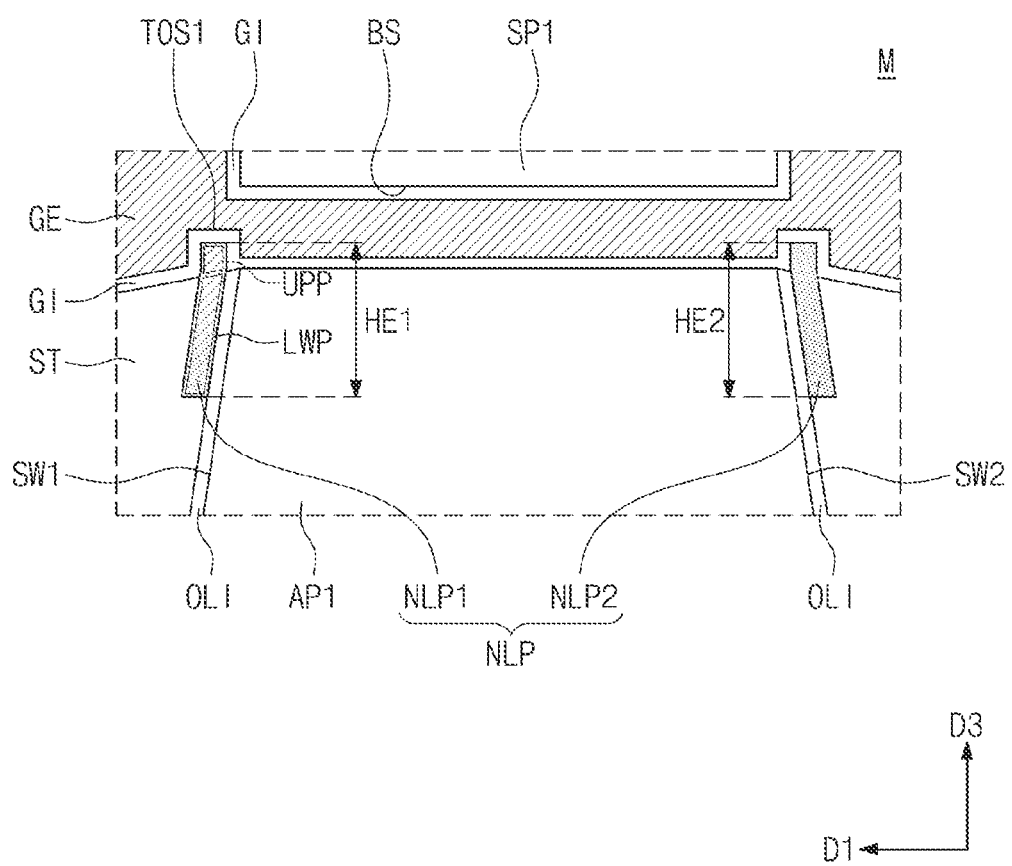
FIG. 3 illustrates an enlarged cross-sectional view showing section M of FIG. 2D.

Referring to FIG. 2C, the passivation pattern NLP may be provided on a lower sidewall of each of the first and second source/drain patterns SD1 and SD2. For example, the passivation pattern NLP may be interposed between the device isolation layer ST and the first and second source/drain patterns SD1 and SD2.

The first source/drain patterns SD1 may include a semiconductor element (e.g., SiGe) whose lattice constant is greater than that of a semiconductor element of the substrate 100. A pair of first source/drain patterns SD1 may therefore provide the first channel pattern CH1 with a compressive stress. The second source/drain patterns SD2 may include the same semiconductor element (e.g., Si) as that of the substrate 100.

Each of the first source/drain patterns SD1 may include a first semiconductor layer SEL1 and a second semiconductor layer SEL2 disposed on the first semiconductor layer SEL1.

Referring to FIG. 2A, the following description will describe a cross-sectional shape in the second direction D2 of the first source/drain pattern SD1.

The first semiconductor layer SEL1 may cover an inner wall of the first recession RS1. The first semiconductor layer SEL1 may have a thickness that decreases in a direction toward an upper portion thereof from a lower portion thereof. For example, a thickness in the third direction D3 of the first semiconductor layer SEL1 on a floor of the first recession RS1 may be greater than a thickness in the second direction D2 of the first semiconductor layer SEL1 on an upper portion of the first recession RS1. The first semiconductor layer SEL1 may be shaped like U along a profile of the first recession RS1.

The second semiconductor layer SEL2 may fill a remaining portion of the first recession RS1 that is filled with the first semiconductor layer SEL1. The second semiconductor layer SEL2 may have a volume greater than that of the first semiconductor layer SEL1. For example, a ratio of the volume of the second semiconductor layer SEL2 to a total volume of the first source/drain pattern SD1 may be greater than a ratio of the volume of the first semiconductor layer SEL1 to a total volume of the first source/drain pattern SD1.

Each of the first and second semiconductor layers SEL1 and SEL2 may include silicon-germanium (SiGe). For example, in an embodiment, the first semiconductor layer SEL1 may contain germanium (Ge) whose concentration is relatively low. In an embodiment, the first semiconductor layer SEL1 may include only silicon (Si) and does not include germanium (Ge). The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may have a germanium concentration of about 30 at % to about 70 at %. The germanium concentration of the second semiconductor layer SEL2 may increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include an impurity (e.g., boron) that causes the first source/drain pattern SD1 to have a p-type conductivity type. An impurity concentration (e.g., atomic percent) of the second semiconductor layer SEL2 may be greater than that of the first semiconductor layer SEL1.

The first semiconductor layer SEL1 may prevent stacking faults between the substrate 100 and the second semiconductor layer SEL2 and between the second semiconductor layer SEL2 and the first, second, and third semiconductor patterns SP1, SP2, and SP3. The occurrence of stacking faults may increase a channel resistance. The stacking faults may occur on the floor of the first recession RS1. Accordingly, in an embodiment, the first semiconductor layer SEL1 adjacent to the floor of the first recession RS1 may have a relatively large thickness to prevent the stacking faults.

The first semiconductor layer SEL1 may protect the second semiconductor layer SEL2 while sacrificial layers SAL are replaced with first, second, and third parts PO1, PO2, and PO3 of a gate electrode GE which will be described below. For example, the first semiconductor layer SEL1 may prevent the second semiconductor layer SEL2 from being etched with an etching material that etches the sacrificial layers SAL.

Gate electrodes GE may be provided to extend in the first direction D1, while running across the first and second channel patterns CH1 and CH2. The gate electrodes GE may be arranged at a first pitch P1 in the second direction D2. Each of the gate electrodes GE may vertically overlap the first and second channel patterns CH1 and CH2.

The gate electrode GE may include a first part PO1 interposed between the first semiconductor pattern SP1 and the active pattern AP1 or AP2, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Referring to FIG. 2A, on the PMOSFET region PR, the gate electrode GE may have different widths at the first, second, and third parts PO1, PO2, and PO3 thereof. For example, a maximum width in the second direction D2 of the third part PO3 may be greater than that in the second direction D2 of the second part PO2. A maximum width in the second direction D2 of the first part PO1 may be greater than that in the second direction D2 of the third part PO3.

Figure 2D:
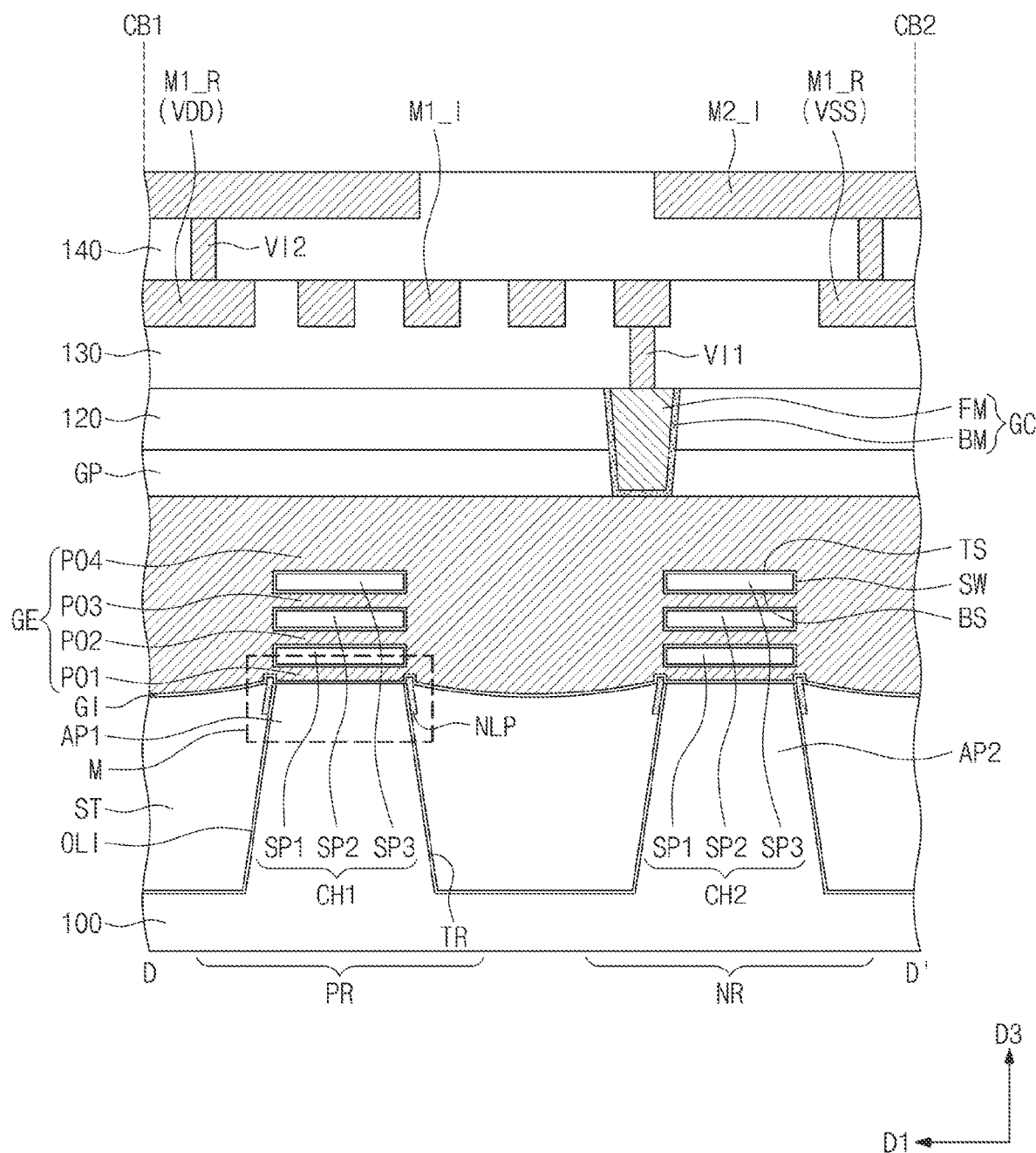

Referring to FIG. 2D, the gate electrode GE may be provided on a top surface TS, a bottom surface BS, and opposite sidewalls SW of each of the first, second, and third semiconductor patterns SP1, SP2, and SP3. Thus, a transistor according to an embodiment may be a three-dimensional field effect transistor (e.g., MBCFET or GAAFET) in which the gate electrode GE three-dimensionally surrounds the first and second channel patterns CH1 and CH2.

Referring to FIGS. 1 and 2A to 2D, a pair of gate spacers GS may be disposed on opposite sidewalls of the fourth part PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be substantially coplanar with that of a first interlayer dielectric layer 110, which will be described below. The gate spacers GS may include at least one of, for example, SiCN, SiCON, and SiN. Alternatively, the gate spacers GS may each include a multi-layer formed of at least two of, for example, SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120, which will be described below. For example, the gate capping pattern GP may include at least one of SiON, SiCN, SiCON, and SiN.

A gate dielectric layer GI may be interposed between the gate electrode GE and the first channel pattern CH1, and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST that underlies the gate electrode GE (see FIG. 2D).

In an embodiment of the present inventive concept, the gate dielectric layer GI may include one or more of a silicon oxide layer, a silicon oxynitride layer, and a high-k dielectric layer. The high-k dielectric layer may include a material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an embodiment, a semiconductor device may include a negative capacitance field effect transistor that uses a negative capacitor. For example, the gate dielectric layer GI may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one of hafnium oxide, hafnium zirconium oxide, barium strontium titanium oxide, and lead zirconium titanium oxide. In an embodiment, the hafnium zirconium oxide may be a material in which hafnium oxide is doped with zirconium (Zr). In an embodiment, the hafnium zirconium oxide may be a compound of hafnium (Hf), zirconium (Zr), and oxygen (O).

The ferroelectric material layer may further include impurities doped thereinto. For example, the impurities may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as, for example, gadolinium (Gd), silicon (Si), zirconium (Zr), aluminum (Al), and yttrium (Y).

When the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one of silicon oxide and high-k dielectric metal oxide. The metal oxide included in the paraelectric material layer may include, for example, at least one of hafnium oxide, zirconium oxide, and aluminum oxide. However, embodiments of the present inventive concept are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm. Because ferroelectric materials have their own critical thickness that exhibits ferroelectric properties, the thickness of the ferroelectric material layer may depend on ferroelectric material.

In an embodiment, the gate dielectric layer GI may include a single ferroelectric material layer. In an embodiment, the gate dielectric layer GI may include a plurality of ferroelectric layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern disposed on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third parts PO1, PO2, and PO3 of the gate electrode GE may be formed of the first metal pattern or a work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). The fourth part PO4 of the gate electrode GE may include, for example, the first metal pattern and the second metal pattern on the first metal pattern.

Referring to FIG. 2B, inner spacers IP may be provided on the NMOSFET region NR. The inner spacers IP may be correspondingly interposed between the second source/drain pattern SD2 and the first, second, and third parts PO1, PO2, and PO3 of the gate electrode GE. The inner spacers IP may be in direct contact with the second source/drain pattern SD2. The inner spacer IP may cause each of the first, second, and third parts PO1, PO2, and PO3 of the gate electrode GE to separate from the second source/drain pattern SD2.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. A second interlayer dielectric layer 120 that covers the gate capping pattern GP may be disposed on the first interlayer dielectric layer 110. For example, the first and second interlayer dielectric layers 110 and 120 may include a silicon oxide layer.

A pair of separation structures DB that are opposite to each other in the second direction D2 may be provided on opposite sides of the logic cell LC. The separation structure DB may extend in the first direction D1 substantially parallel to the gate electrodes GE. The separation structure DB and its adjacent gate electrode GE may be arranged at a first pitch P1.

The separation structure DB may penetrate the first and second interlayer dielectric layers 110 and 120, and may extend into the first and second active patterns AP1 and AP2. The separation structure DB may penetrate the first and second channel patterns CH1 and CH2. The separation structure DB may separate the PMOSFET and NMOSFE regions PR and NR of the logic cell LC from a PMOSFET or NMOSFET region of an adjacent logic cell.

Active contacts AC may penetrate the first and second interlayer dielectric layers 110 and 120 and correspondingly be electrically connected to the first and second source/drain patterns SD1 and SD2. A pair of active contacts AC may be provided on opposite sides of the gate electrode GE. In a plan view, the active contact AC may have a bar shape that extends in the first direction D1.

The active contact AC may be a self-aligned contact. For example, the gate capping pattern GP and the gate spacer GS may be used to form the active contact AC in a self-aligned manner. For example, the active contact AC may cover at least a portion of a sidewall of the gate spacer GS. In an embodiment, the active contact AC may partially cover a portion of the top surface of the gate capping pattern GP.

Silicide patterns SC may be correspondingly interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide such as, for example, at least one of titanium silicide, tantalum silicide, tungsten silicide, nickel silicide, and cobalt silicide.

A gate contact GC may penetrate the second interlayer dielectric layer 120 and the gate capping pattern GP and be electrically connected to the gate electrode GE. For example, referring to FIG. 2B, an upper dielectric pattern UIP may fill an upper portion, which is adjacent to the gate contact CG, of each of the active contacts AC. Therefore, according to embodiments of the inventive concept, a process failure such as an electrical short caused by contact between the gate contact GC and its adjacent active contact AC may be prevented.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one of, for example, titanium, tantalum, tungsten, nickel, cobalt, and platinum. The metal nitride layer may include at least one of, for example, a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in a third interlayer dielectric layer 130. The first metal layer M1 may include first lower lines M1_R, second lower lines M1_I, and lower vias VI1. The lower vias VI1 may be provided below the first and second lower lines M1_R and M1_I.

Each of the first lower lines M1_R may extend in the second direction D2, while running across the logic cell LC. Each of the first lower lines M1_R may be a power line. For example, the first lower line M1_R may be supplied with a drain voltage VDD or a source voltage VSS.

Referring to FIG. 1, the logic cell LC may include a first cell boundary CB1 that extends in the second direction D2. On the logic cell LC, a second cell boundary CB2 may be defined on a location opposite to that on which the first cell boundary CB1 is defined. The first lower line M1_R to which the drain voltage VDD or power voltage is applied may be disposed on the first cell boundary CB1. The first lower line M1_R to which the drain voltage VDD is applied may extend in the second direction D2 along the first cell boundary CB1. The first lower line M1_R to which the source voltage VSS or ground voltage is applied may be disposed on the second cell boundary CB2. The first lower line M1_R to which the source voltage VSS is applied may extend in the second direction D2 along the second cell boundary CB2.

The second lower lines M1_I may be disposed along the first direction D1 between the first lower line M1_R to which the drain voltage VDD is applied and the first lower line M1_R to which the source voltage VSS is applied. Each of the second lower lines M1_I may have a linear or bar shape that extends in the second direction D2. The second lower lines M1_I may be arranged at a second pitch P2 in the first direction D1. The second pitch P2 may be less than the first pitch P1.

The lower vias VI1 may be provided below the first and second lower lines M1_R and M1_I of the first metal layer M1. The lower vias VI1 may be correspondingly interposed between the active contacts AC and the first and second lower lines M1_R and M1_I. The lower vias VI1 may be correspondingly interposed between the gate contacts GC and the second lower lines M1_I.

The lower line M1_R or M1_I and its underling lower via VI1 of the first metal layer M1 may be formed by separate processes from each other. For example, the lower line M1_R or M1_I and the lower via VI1 may each be formed by a single damascene process. A sub-20 nm process may be employed to fabricate a semiconductor device according to an embodiment.

A second metal layer M2 may be provided in a fourth interlayer dielectric layer 140. The second metal layer M2 may include upper lines M2_I. Each of the upper lines M2_I may have a linear or bar shape that extends in the second direction D2. For example, the upper lines M2_I may extend substantially parallel to each other in the first direction D1. In a plan view, the upper lines M2_I may be substantially parallel to the gate electrodes GE. The upper lines M2_I may be arranged at a third pitch P3 along the second direction D2. The third pitch P3 may be less than the first pitch P1. The third pitch P3 may be greater than the second pitch P2.

The second metal layer M2 may further include upper vias VI2. The upper vias VI2 may be provided below the upper lines M2_I. The upper vias VI2 may be correspondingly interposed between the upper lines M2_I and the lower lines M1_R and M1_I.

The upper line M2_I of the second metal layer M2 and its underlying upper via VI2 may be formed into a single piece in the same process. For example, a dual damascene process may be employed to substantially simultaneously form the upper via VI2 and the upper line M2_I of the second metal layer M2.

The lower lines M1_R and M1_I of the first metal layer M1 may include a conductive material that is the same as or different from that of the upper lines M2_I of the second metal layer M2. For example, the lower lines M1_R and M1_I and the upper lines M2_I may include at least one metallic material selected from aluminum, copper, tungsten, molybdenum, and cobalt.

In an embodiment of the present inventive concept, metal layers (e.g., M3, M4, M5, etc.) may be additionally stacked on the fourth interlayer dielectric layer 140. Each of the stacked metal layers may include routing lines.

Referring to FIG. 3, the following description will describe in detail the passivation pattern NLP disposed on the first active pattern AP1. The first active pattern AP1 may have a first sidewall SW1 and a second sidewall SW2 that are opposite to each other in the first direction D1. The passivation pattern NLP may include a first passivation pattern NLP1 disposed on the first sidewall SW1 and a second passivation pattern NLP2 disposed on the second sidewall SW2.

For example, the first passivation pattern NLP1 may include an upper part UPP that upwardly protrudes from the device isolation layer ST and a lower part LWP that is buried in the device isolation layer ST. The upper part UPP may have a first top surface TOS1 higher than a second top surface TOS2 of the first active pattern AP1. The first top surface TOS1 of the upper part UPP may be lower than the bottom surface BS of the first semiconductor pattern SP1 (e.g., the lowermost one of the semiconductor patterns SP1, SP2 and SP3). For example, the first top surface TOS1 of the upper part UPP may be located at a level between the second top surface TOS2 of the first active pattern AP1 and the bottom surface BS of the first semiconductor pattern SP1. The lower part LWP may face the first sidewall SW1 of the first active pattern AP1 across the liner layer OLI.

The gate dielectric layer GI may extend from the top surface of the device isolation layer ST toward the second top surface TOS2 of the first active pattern AP1, while running across the upper part UPP of the first passivation pattern NLP1. The gate dielectric layer GI may directly cover the first top surface TOS1 and opposite sidewalls of the upper part UPP. For example, the gate dielectric layer GI may directly contact and cover the first top surface TOS1 and opposite sidewalls of the upper part UPP. The gate dielectric layer GI may have a structure that protrudes along a profile of the upper part UPP.

The first passivation pattern NLP1 may have a first height HE1, and the second passivation pattern NLP2 may have a second height HE2. For example, the first height HE1 may be a length in the third direction D3 from a bottom surface (or lowermost portion) of the first passivation pattern NLP1 to the first top surface TOS1 (or uppermost portion). The first height HE1 may be used to define a size of the first passivation pattern NLP1, and the second height HE2 may be used to define a size of the second passivation pattern NLP2.

According to an embodiment, the first and second passivation patterns NLP1 and NLP2 may have substantially the same size as each other. For example, the first and second heights HE1 and HE2 may be substantially the same as each other.

According to an embodiment of the present inventive concept, the first and second passivation patterns NLP1 and NLP2 may have different sizes from each other. For example, the first and second heights HE1 and HE2 may be different from each other.

According to some embodiments of the present inventive concept, the passivation pattern NLP may prevent the top surface of the device isolation layer ST from being excessively recessed, which may deteriorate electrical characteristics of semiconductor devices. The passivation pattern NLP may stably form the first, second, and third semiconductor patterns SP1, SP2, and SP3 and the first, second, and third parts PO1, PO2, and PO3 of the gate electrode GE between the first, second, and third semiconductor patterns SP1, SP2, and SP3, and thus, reliability and electrical characteristics may be increased.

FIGS. 4A to 10D illustrate cross-sectional views showing a method of fabricating a semiconductor device according to some embodiments of the present inventive concept. In detail, FIGS. 4A, 5A, 6A, 7A, 8A, 9A, and 10A illustrate cross-sectional views taken along line A-A' of FIG. 1 according to some embodiments of the present inventive concept. FIGS. 7B, 8B, 9B, and 10B illustrate cross-sectional views taken along line B-B' of FIG. 1. FIGS. 7C, 8C, 9C, and 10C illustrate cross-sectional views taken along line C-C' of FIG. 1. FIGS. 4B, 5B, 6B, 7D, 8D, 9D, and 10D illustrate cross-sectional views taken along line D-D' of FIG. 1.

Figure 4A:
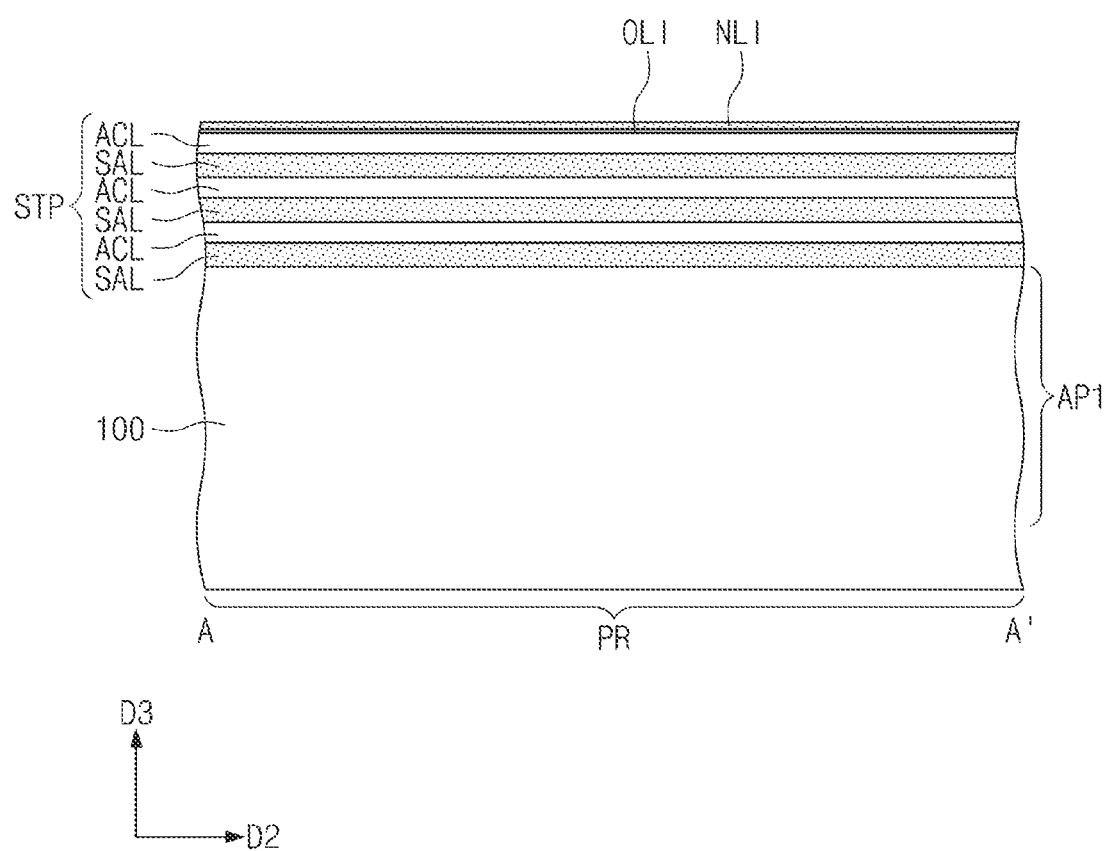
FIGS. 4A, 5A, 6A, 7A, 8A, 9A, and 10A illustrate cross-sectional views taken along line A-A' of FIG. 1 according to some embodiments of the present inventive concept.
Figure 4B:
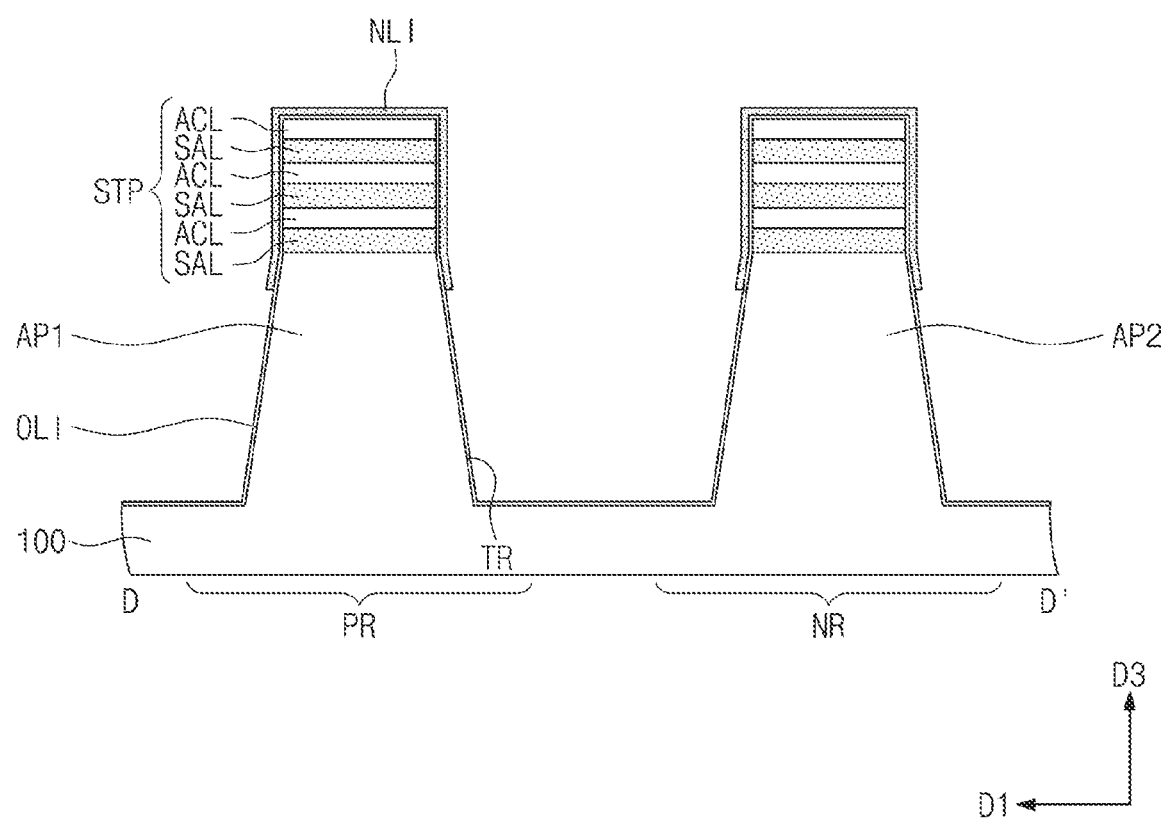
FIGS. 4B, 5B, 6B, 7D, 8D, 9D, and 10D illustrate cross-sectional views taken along line D-D' of FIG. 1 according to some embodiments of the present inventive concept.

Referring to FIGS. 4A and 4B, a substrate 100 may include a PMOSFET region PR and an NMOSFET region NR. Sacrificial layers SAL and active layers ACL may be alternately formed and stacked on the substrate 100. The sacrificial layers SAL may include one of, for example, silicon (Si), germanium (Ge), and silicon-germanium (SiGe), and the active layers ACL may include another of, for example, silicon (Si), germanium (Ge), and silicon-germanium (SiGe).

For example, the sacrificial layers SAL may include silicon-germanium (SiGe), and the active layers ACL may include silicon (Si). Each of the sacrificial layers SAL may have a germanium concentration of about 10 at % to about 30 at %.

Mask patterns may be correspondingly formed on the PMOSFET and NMOSFET regions PR and NR of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 and the second active pattern AP2 may be respectively formed on the PMOSFET region PR and the NMOSFET region NR. A stack pattern STP may be formed on each of the first and second active patterns AP1 and AP2. The stack pattern STP may include the sacrificial layers SAL and the active layers ACL that are alternately stacked. During the patterning process, the stack pattern STP may be formed together with the first and second active patterns AP1 and AP2.

A liner layer OLI may be formed on the first and second active patterns AP1 and AP2. An atomic layer deposition (ALD) process may be performed to conformally form the liner layer OLI. The liner layer OLI may cover the stack patterns STP and the first and second active patterns AP1 and AP2. The liner layer OLI may include a silicon oxide layer.

A passivation layer NLI may be formed on the liner layer OLI. The passivation layer NLI may be selectively formed on the stack pattern STP. For example, the passivation layer NLI may not be formed on a sidewall of each of the first and second active patterns AP1 and AP2. The passivation layer NLI may not be formed in the trench TR. The passivation layer NLI may include, for example, SiOC, SiN, SiC, AlO, $TiO_2$, or a combination thereof. For example, the passivation layer NLI may include SiN. A detailed description of the formation of the passivation layer NLI will be described below with reference to FIGS. 11 to 17.

Figure 5A:
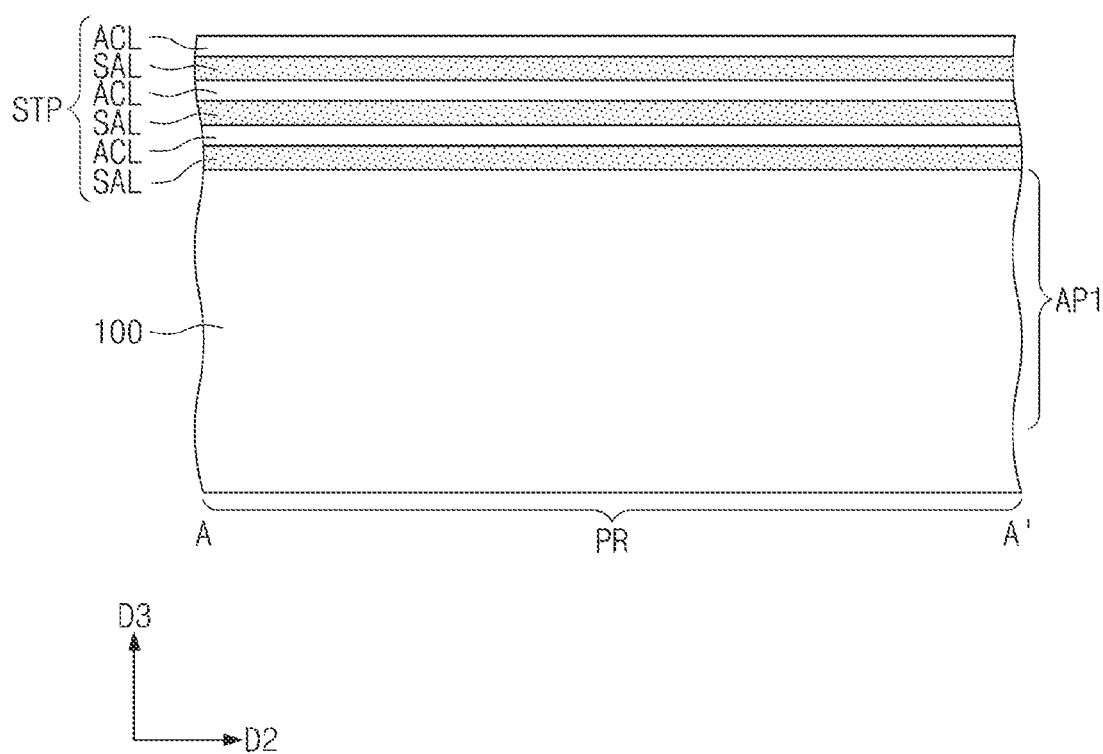
Figure 5B:
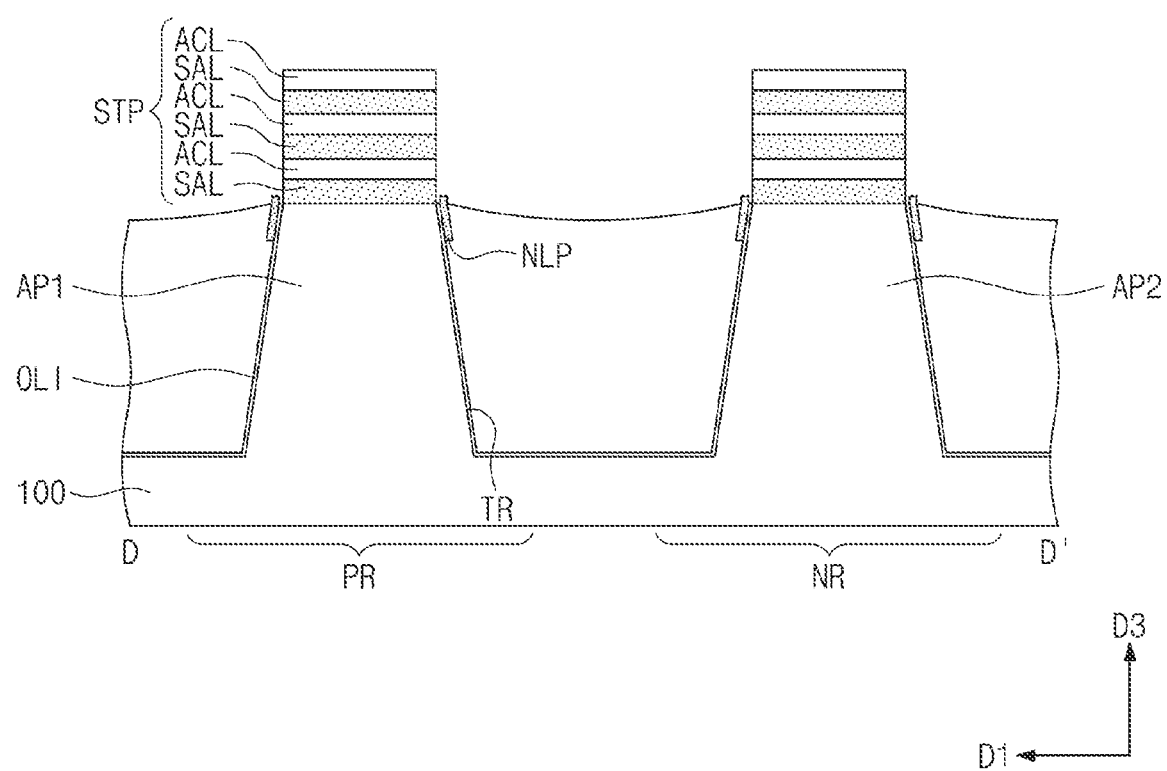

Referring to FIGS. 5A and 5B, a device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, which may form the device isolation layer ST.

The device isolation layer ST may include a dielectric material, such as a silicon oxide layer. The stack patterns STP may upwardly protrude from the device isolation layer ST. For example, the stack patterns STP may vertically protrude upwardly from the device isolation layer ST.

An etching process may be performed to etch and remove the liner layer OLI and the passivation layer NLI on the stack patterns STP. The removal of the liner layer OLI and the passivation layer NLI may expose the active layers ACL and the sacrificial layers SAL of the stack pattern STP. During the etching process, at least a portion of the passivation layer NLI may not be removed, but may remain to form a passivation pattern NLP.

The passivation pattern NLP may be interposed between the device isolation layer ST and the first and second active patterns AP1 and AP2. An upper portion of the passivation pattern NLP may protrude upwardly (see FIG. 3).

Figure 6A:
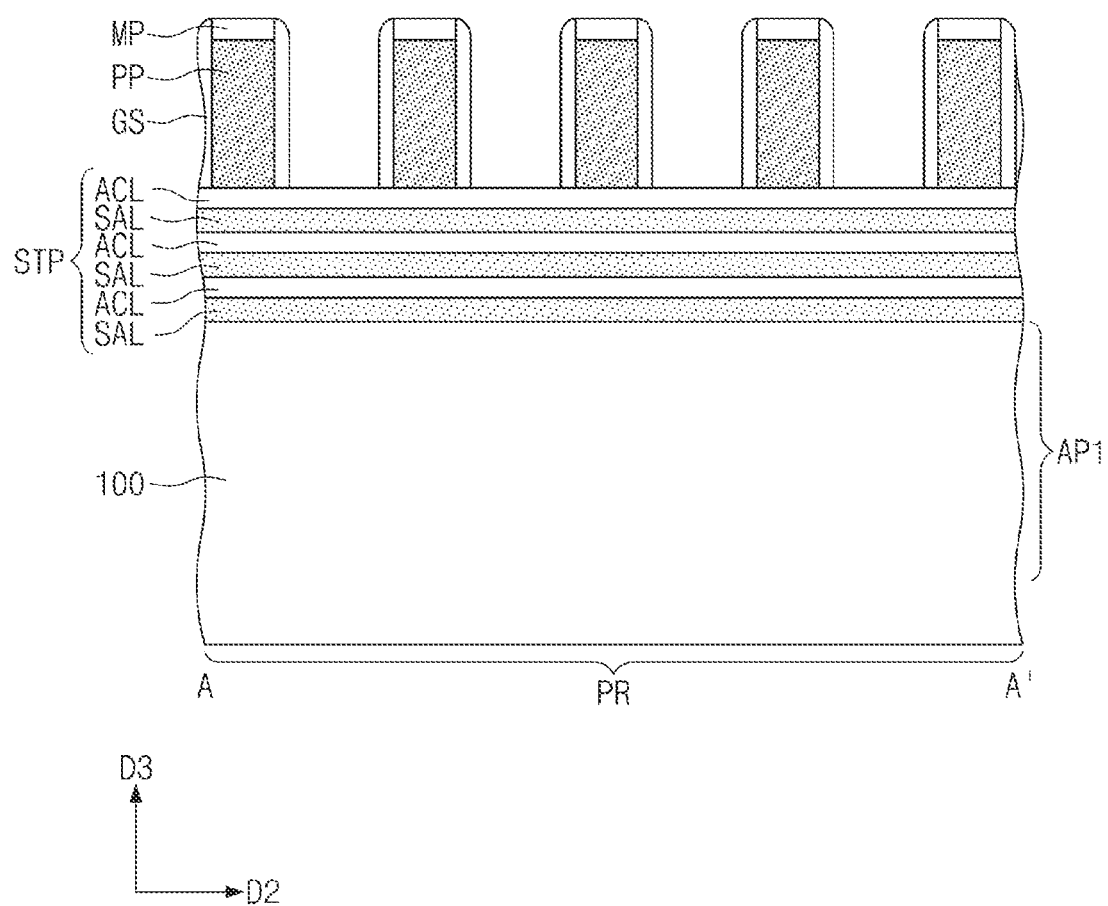
Figure 6B:
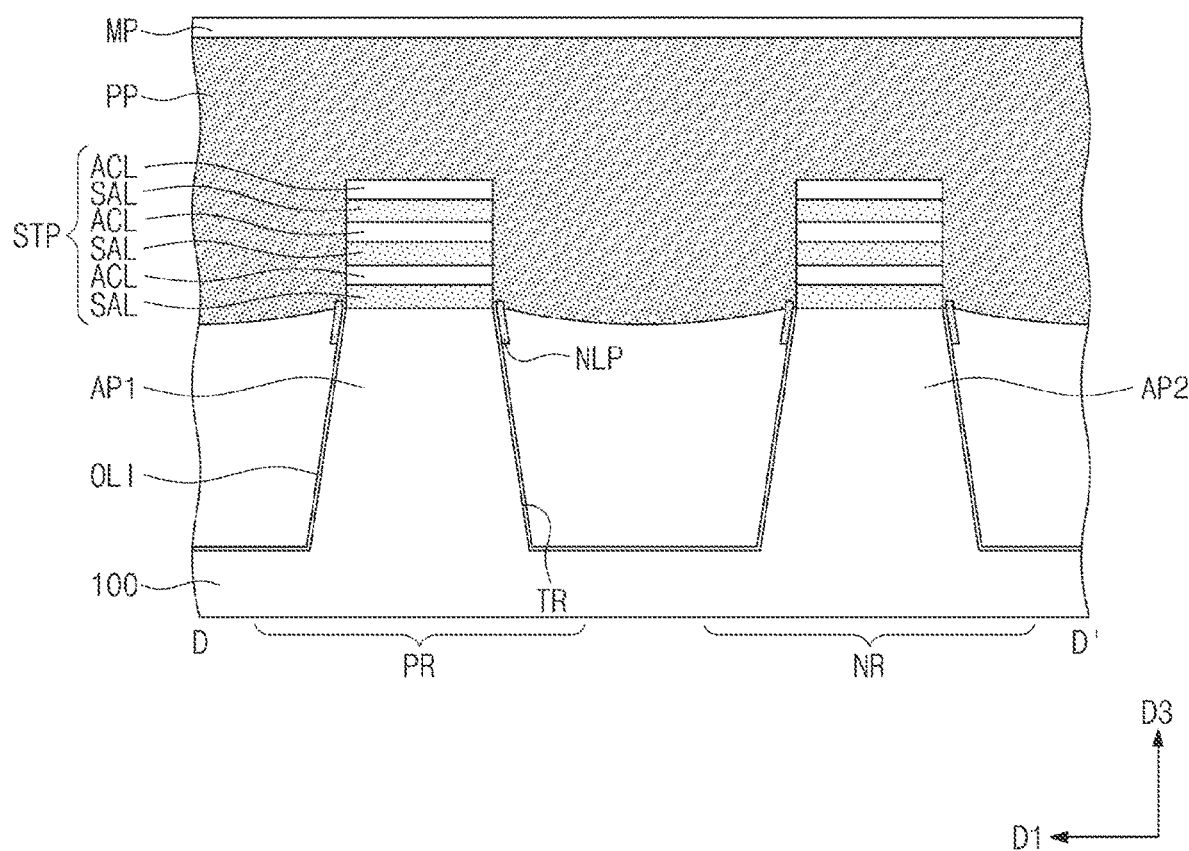
Figure 7A:
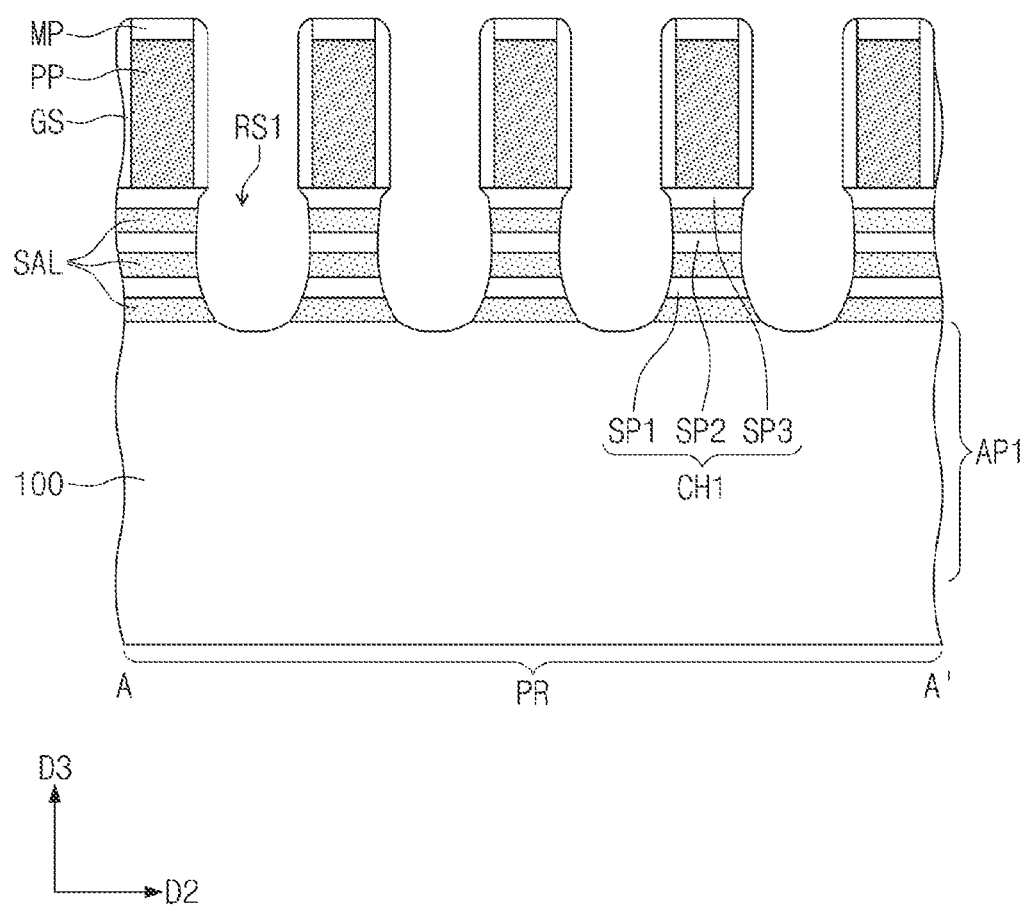
Figure 7B:
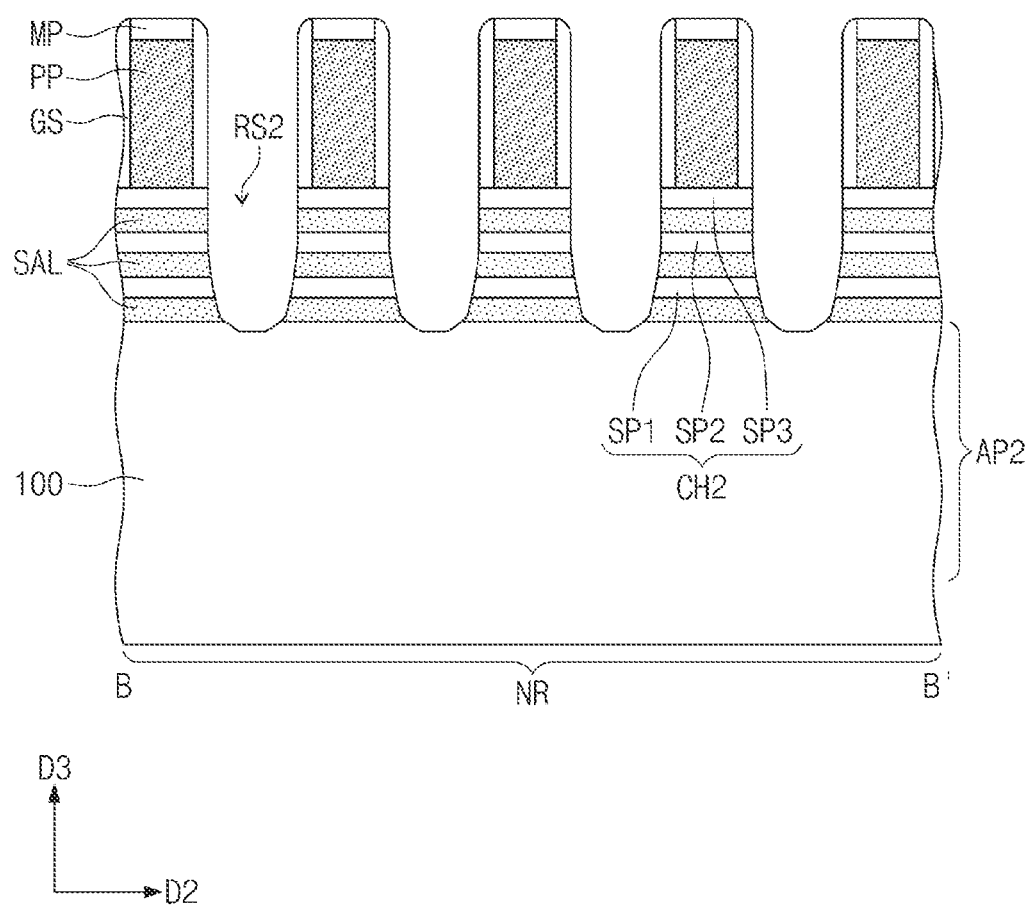
FIGS. 7B, 8B, 9B, and 10B illustrate cross-sectional views taken along line B-B' of FIG. 1 according to some embodiments of the present inventive concept.
Figure 7C:
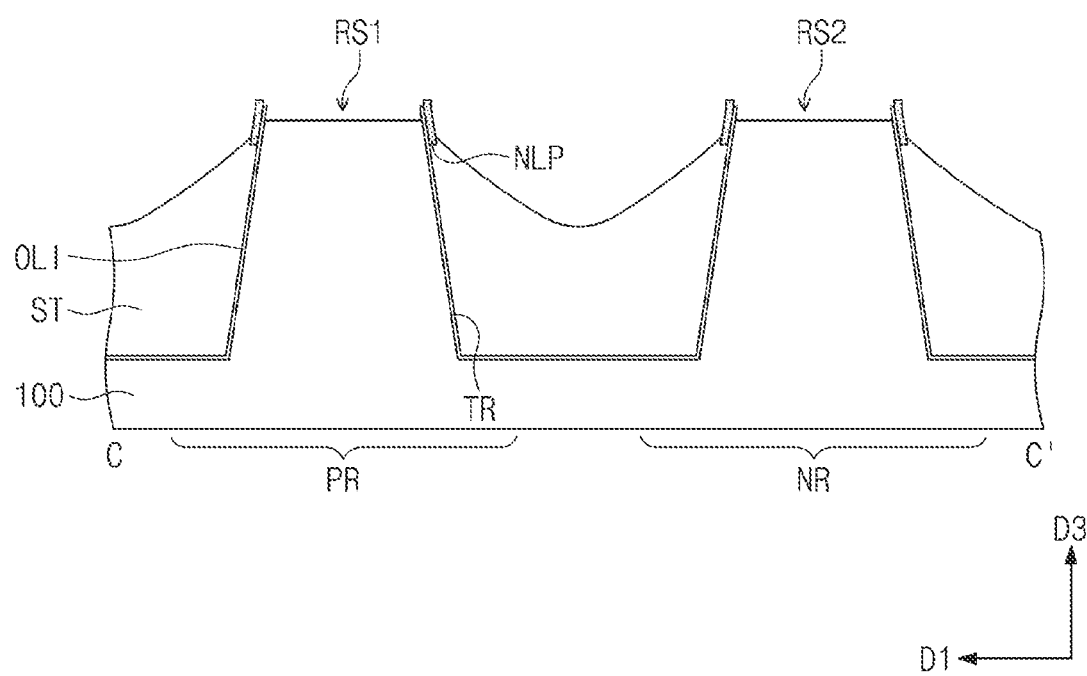
FIGS. 7C, 8C, 9C, and 10C illustrate cross-sectional views taken along line C-C' of FIG. 1 according to some embodiments of the present inventive concept.
Figure 7D:
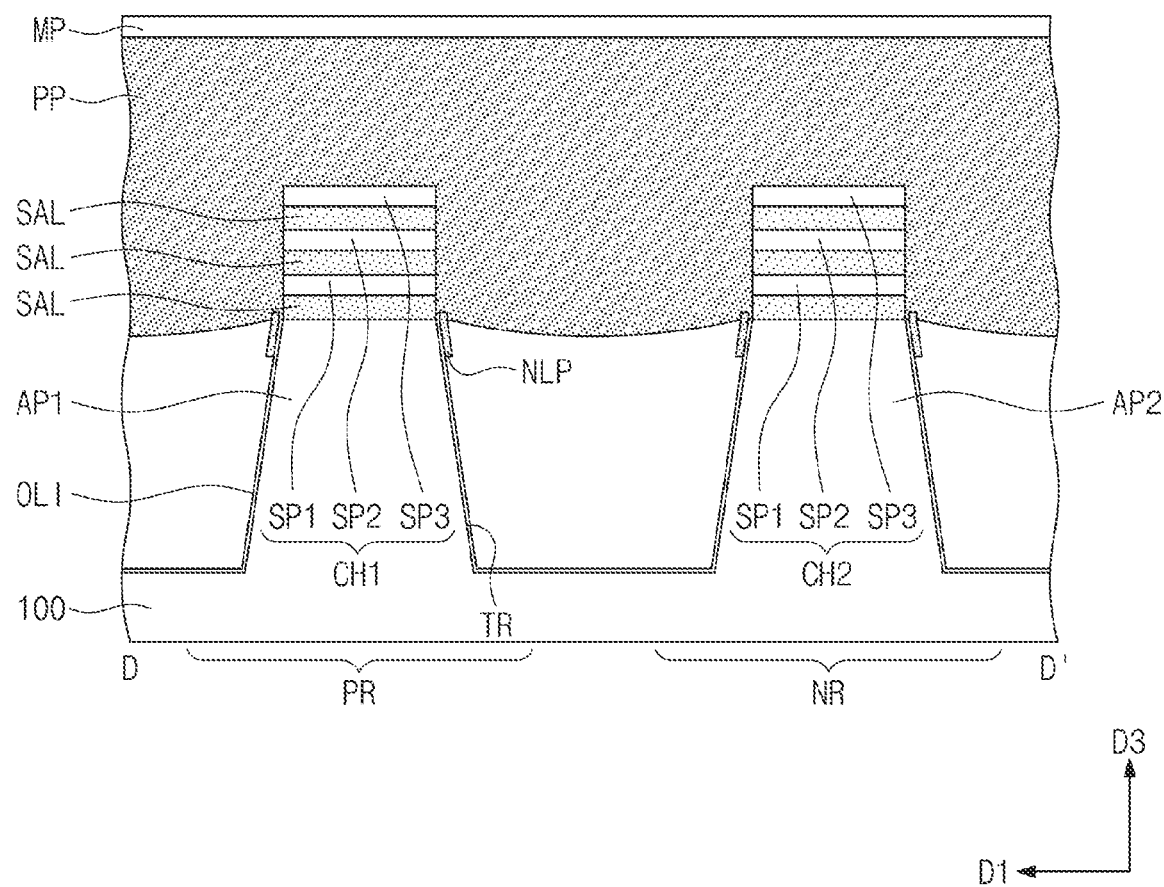
Figure 8A:
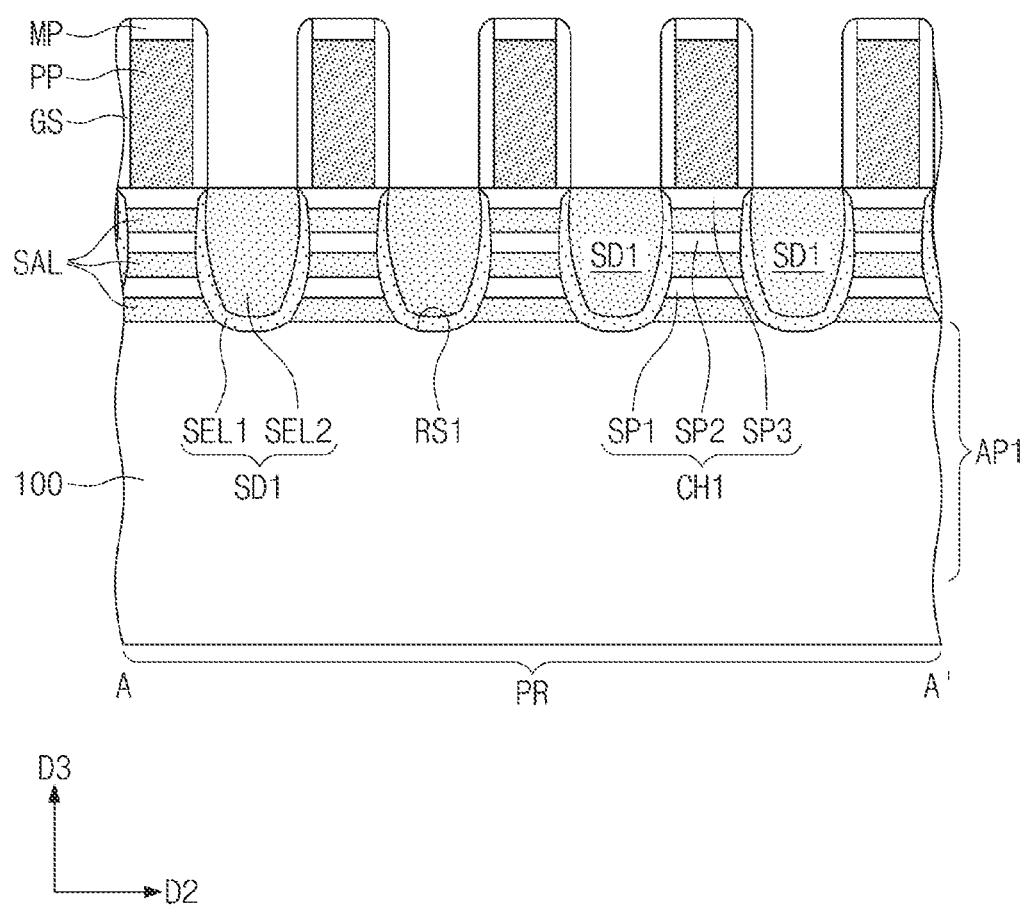
Figure 8B:
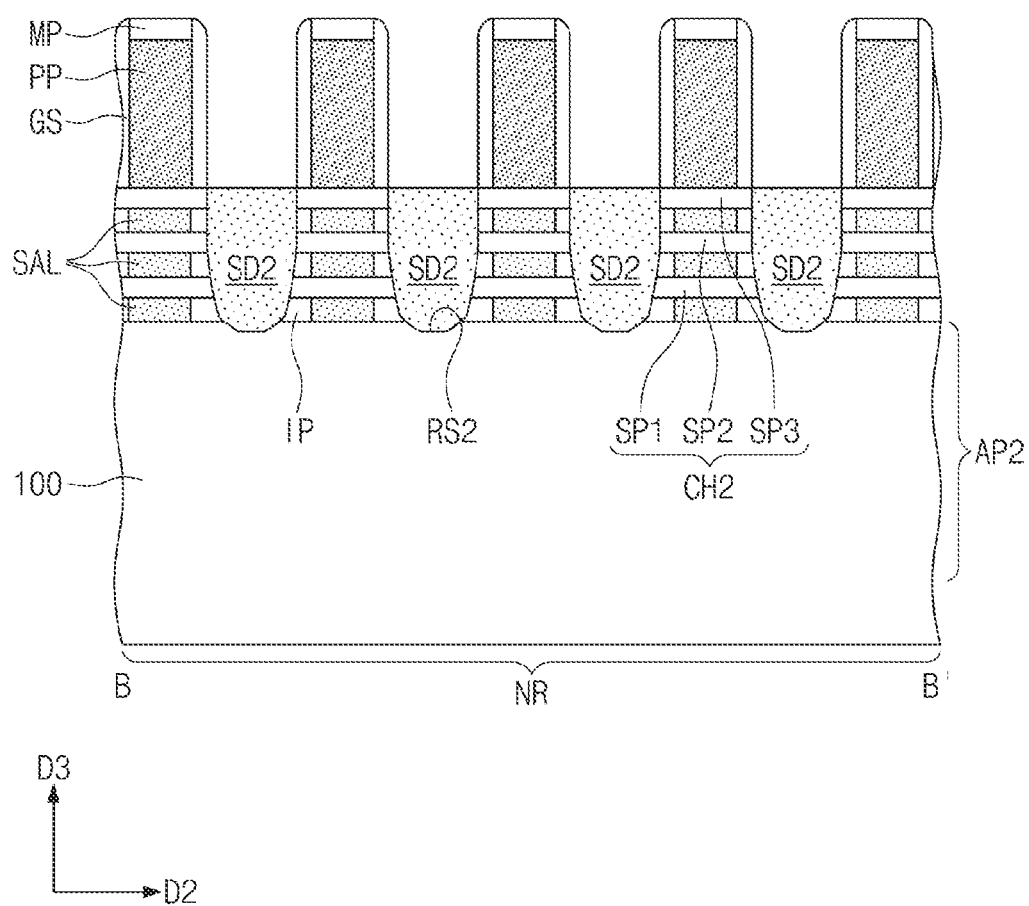
Figure 8C:
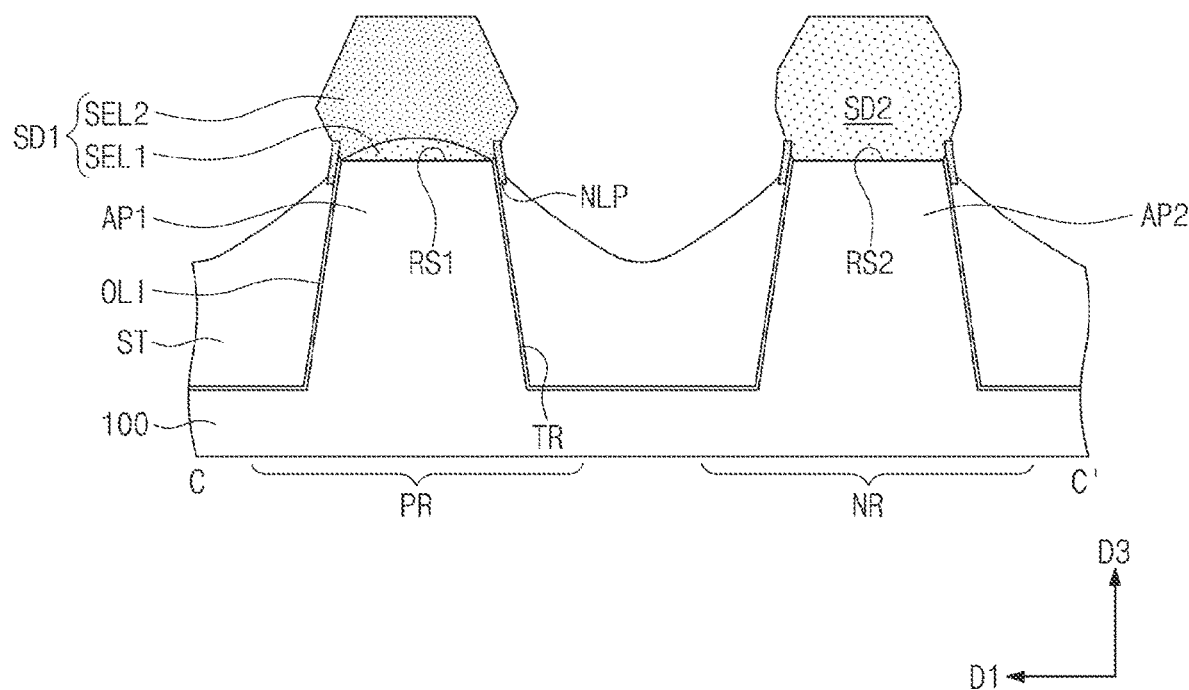
Figure 8D:
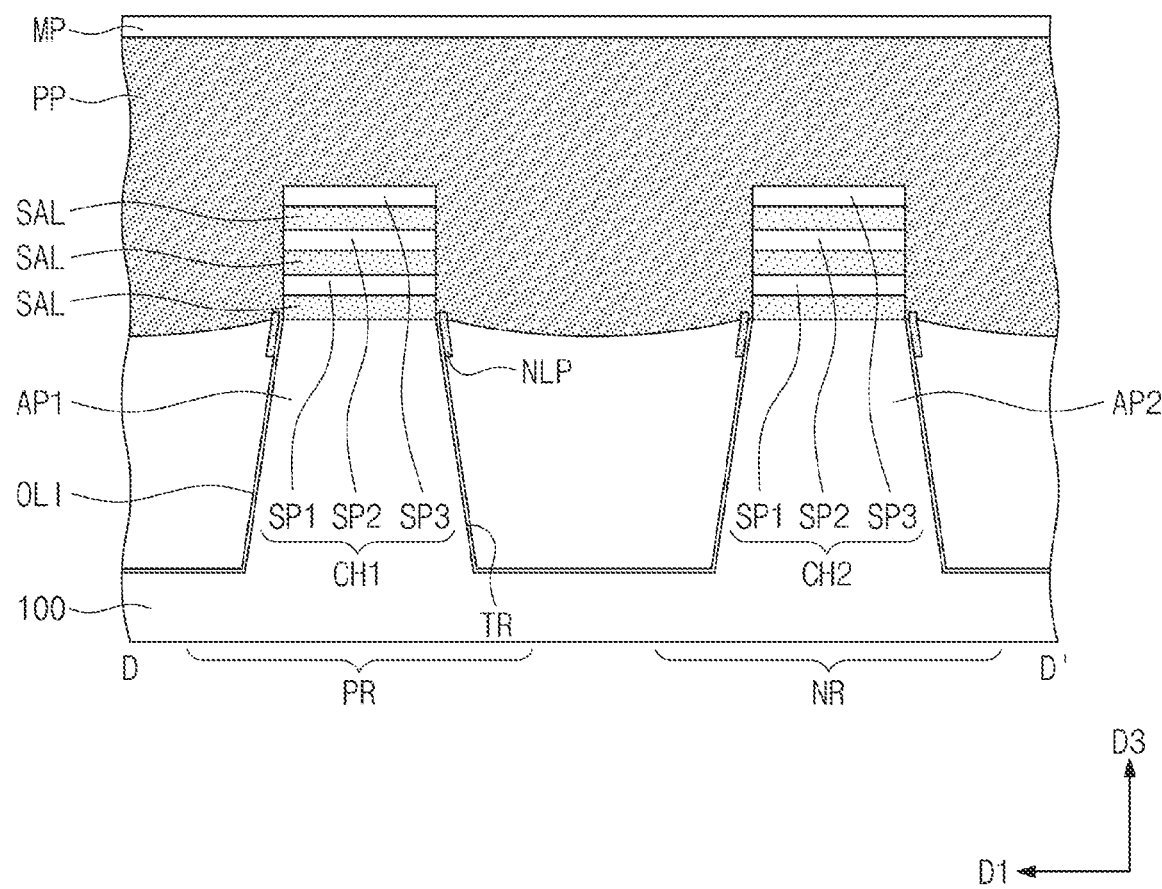

Referring to FIGS. 6A and 6B, sacrificial patterns PP may be formed on the substrate 100 to run across the stack patterns STP. Each of the sacrificial patterns PP may be formed to have a linear or bar shape that extends in a first direction D1. The sacrificial patterns PP may be arranged at a certain pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one of, for example, SiCN, SiCON, and SiN. Alternatively, the gate spacer layer may be a multi-layer including at least two of, for example, SiCN, SiCON, and SiN.

Referring to FIGS. 7A to 7D, first recessions RS1 may be formed in the stack pattern STP on the first active pattern AP1. Second recessions RS2 may be formed in the stack pattern STP on the second active pattern AP2. During formation of the first and second recessions RS1 and RS2, the device isolation layer ST may further be recessed on opposite sides of each of the first and second active patterns AP1 and AP2 (see FIG. 7C).

For example, the hardmask patterns MP and the gate spacers GS may be used as an etching mask such that the stack pattern STP on the first active pattern AP1 may be etched to form the first recessions RS1. The first recession RS1 may be formed between a pair of sacrificial patterns PP. The second recessions RS2 in the stack pattern STP on the second active pattern AP2 may be formed by the same method used for the formation of the first recessions RS1.

The active layers ACL may be formed into first, second, and third semiconductor patterns SP1, SP2, and SP3 that are sequentially stacked between the first recessions RS1. The active layers ACL may be formed into first, second, and third semiconductor patterns SP1, SP2, and SP3 that are sequentially stacked between the second recessions RS2. A first channel pattern CH1 may be constituted by the first, second, and third semiconductor patterns SP1, SP2, and SP3 between the first recessions RS1, and a second channel pattern CH2 may be constituted by the first, second, and third semiconductor patterns SP1, SP2, and SP3 between the second recessions RS2.

Referring to FIGS. 8A to 8D, first source/drain patterns SD1 may be formed in corresponding first recessions RS1. For example, a first selective epitaxial growth (SEG) process may be performed in which an inner wall of the first recession RS1 is used as a seed layer to form a first semiconductor layer SEL1. The first, second, and third semiconductor patterns SP1, SP2, and SP3 and the substrate 100 that are exposed to the first recession RS1 may be used as a seed from which the semiconductor layer SEL1 is grown. For example, the first SEG process may include chemical vapor deposition (CVD) or molecular beam epitaxy (MBE).

The first semiconductor layer SEL1 may include a semiconductor element (e.g., SiGe) whose lattice constant is greater than that of a semiconductor element included in the substrate 100. The first semiconductor layer SEL1 may contain germanium (Ge) whose concentration is relatively low. In an embodiment of the present inventive concept, the first semiconductor layer SEL1 may include only silicon (Si) and does not include germanium (Ge). The first semiconductor layer SEL1 may have a germanium concentration of about 0 at % to about 10 at %.

The first semiconductor layer SEL1 may undergo a second selective epitaxial growth (SEG) process to form a second semiconductor layer SEL2. The second semiconductor layer SEL2 may be formed to completely fill the first recession RS1. The second semiconductor layer SEL2 may contain germanium (Ge) whose concentration is relatively high. For example, the second semiconductor layer SEL2 may have a germanium concentration of about 30 at % to about 70 at %.

The first semiconductor layer SEL1 and the second semiconductor layer SEL2 may constitute the first source/drain pattern SD1. In an embodiment, impurities may be in-situ implanted during the first and second SEG processes. In an embodiment, after the first source/drain pattern SD1 is formed, impurities may be implanted into the first source/drain pattern SD1. The first source/drain pattern SD1 may be doped have a first conductivity type (e.g., p-type).

Second source/drain patterns SD2 may be formed in corresponding second recessions RS2. For example, a selective epitaxial growth (SEG) process may be performed in which an inner wall of the second recession RS2 is used as a seed to form the second source/drain pattern SD2. For example, the second source/drain pattern SD2 may include the same semiconductor element (e.g., Si) as that of the substrate 100. The second source/drain pattern SD2 may be doped to have a second conductivity type (e.g., n-type). Inner spacers IP may be correspondingly formed between the second source/drain pattern SD2 and the sacrificial layers SAL.

Referring to FIGS. 9A to 9D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface that is substantially coplanar with those of the sacrificial patterns PP and those of the gate spacers GS.

The exposed sacrificial patterns PP may be selectively removed. The removal of the sacrificial patterns PP may form first empty spaces ET1 that expose the first and second channel patterns CH1 and CH2 (see FIG. 9D).

Figure 9A:
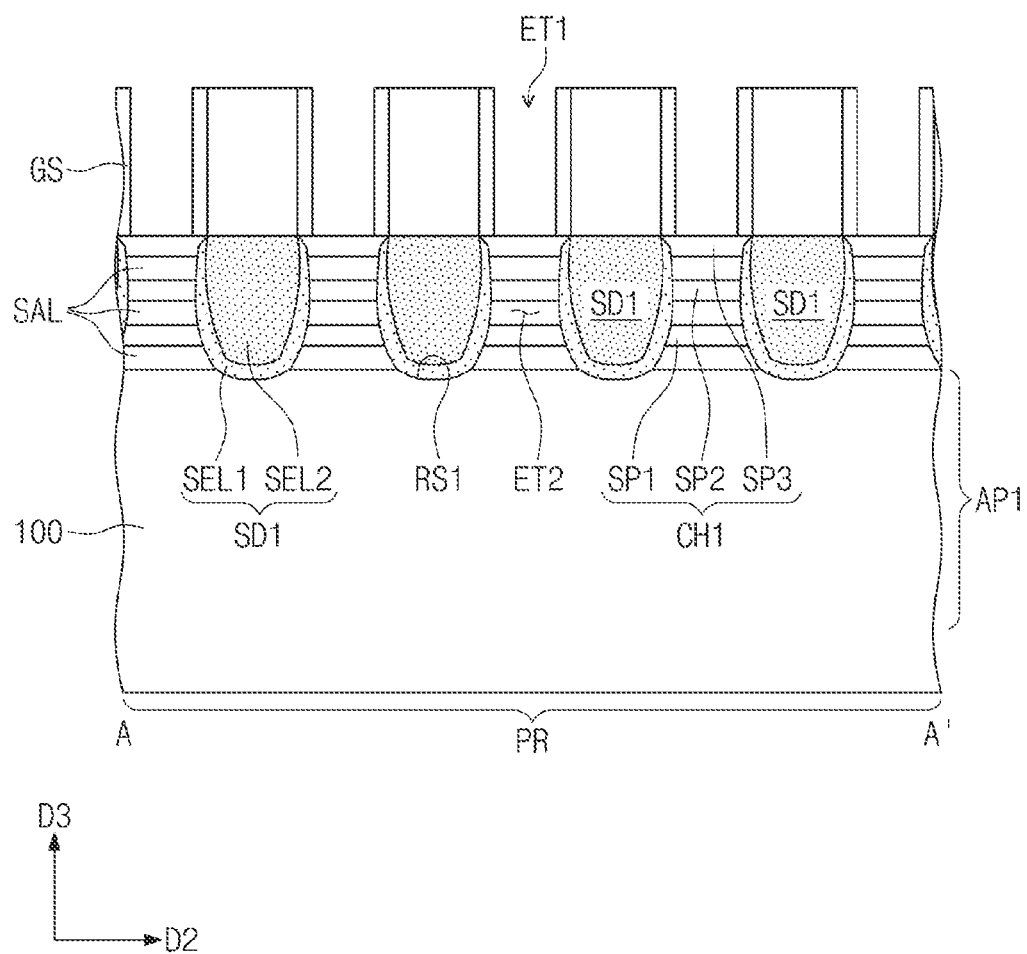
Figure 9B:
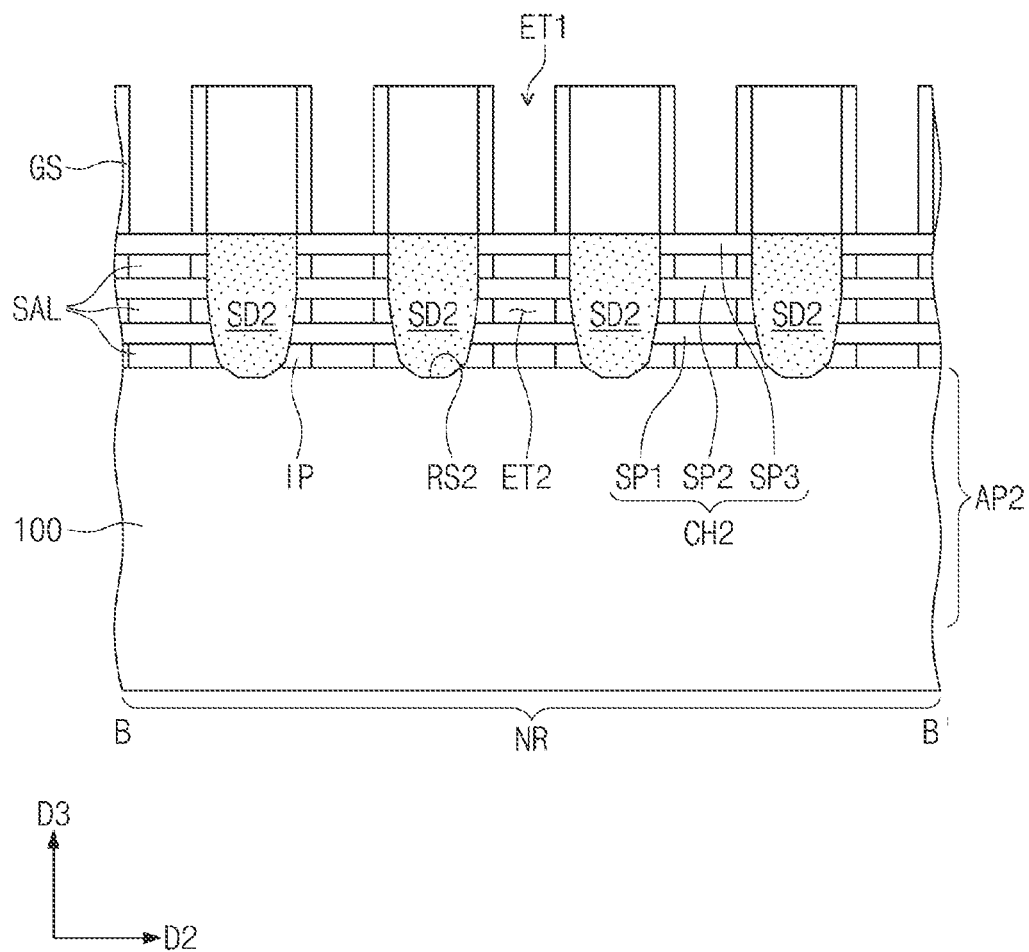
Figure 9C:
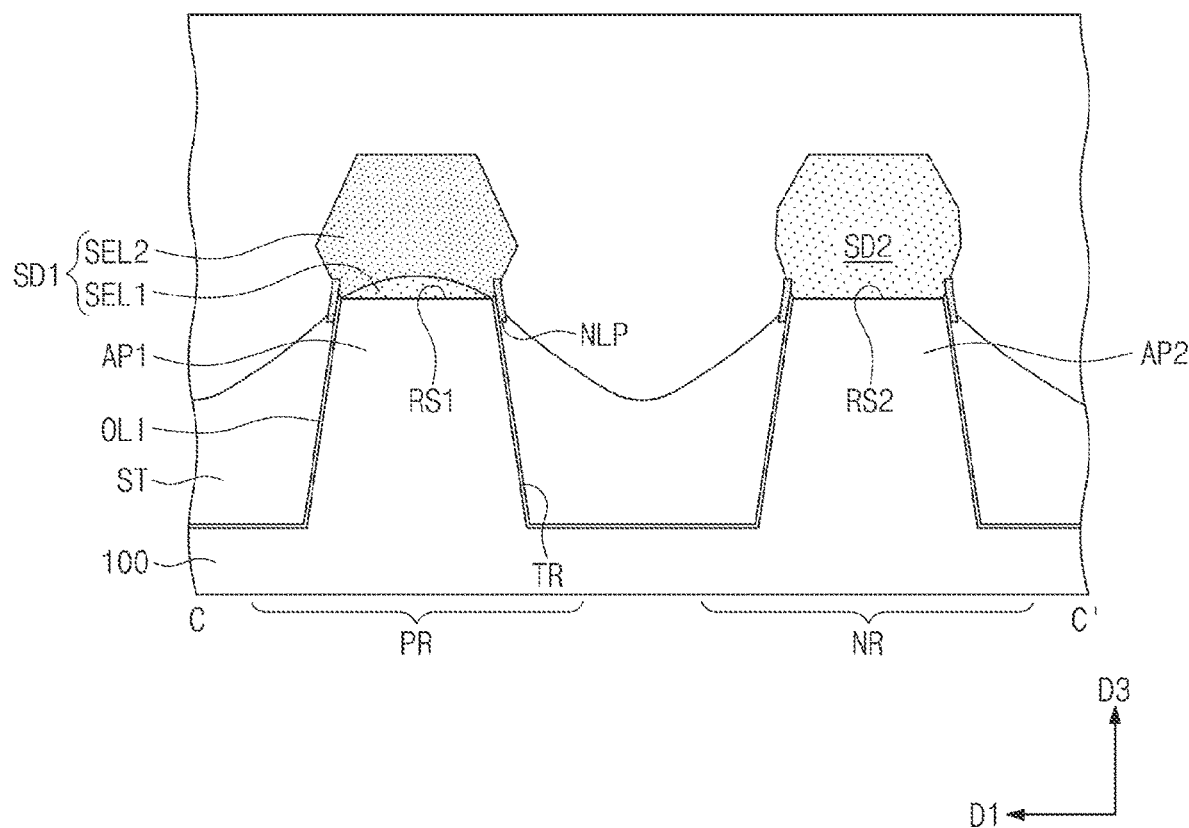
Figure 9D:
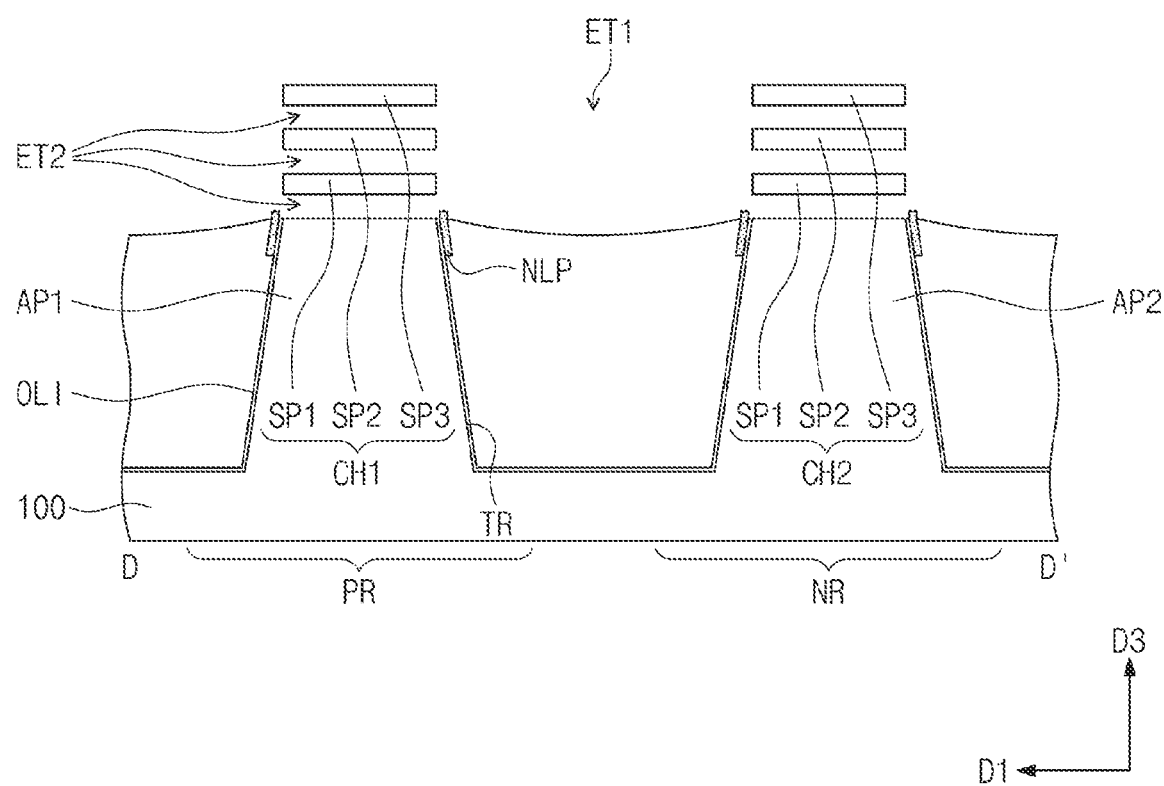
Figure 10A:
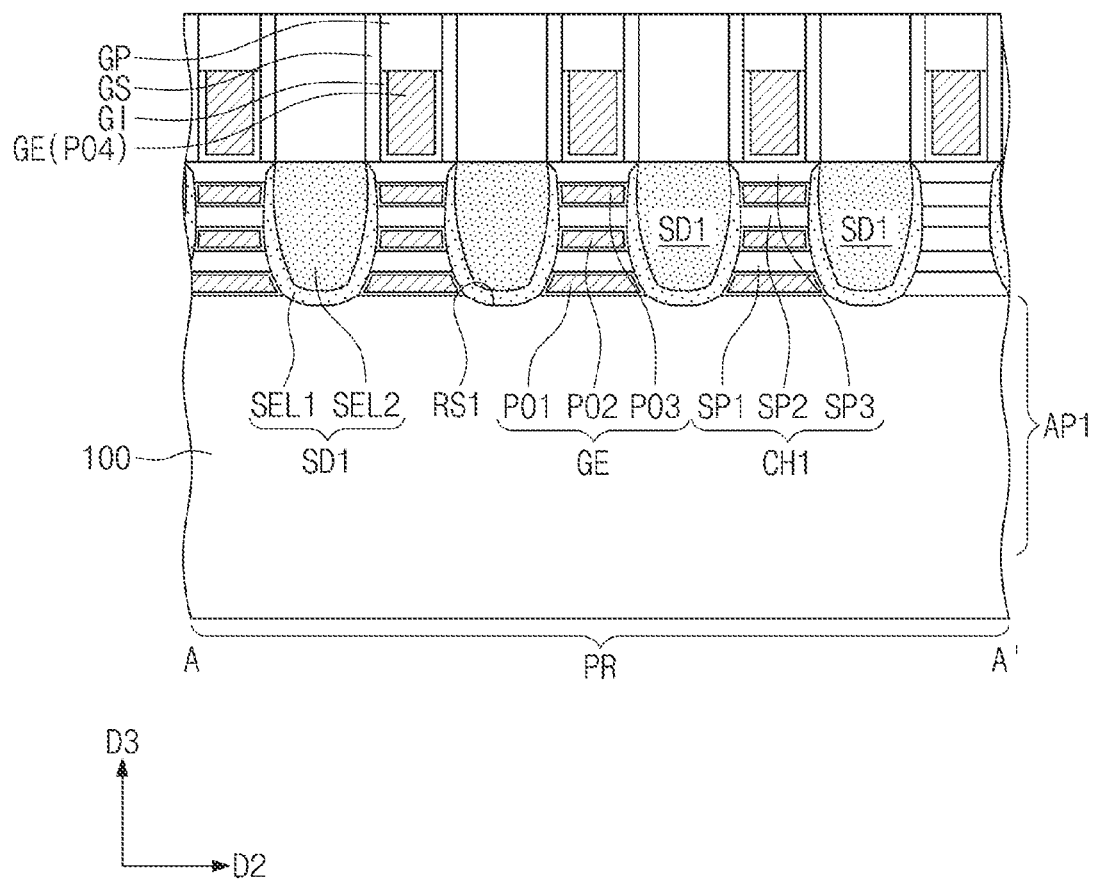
Figure 10B:
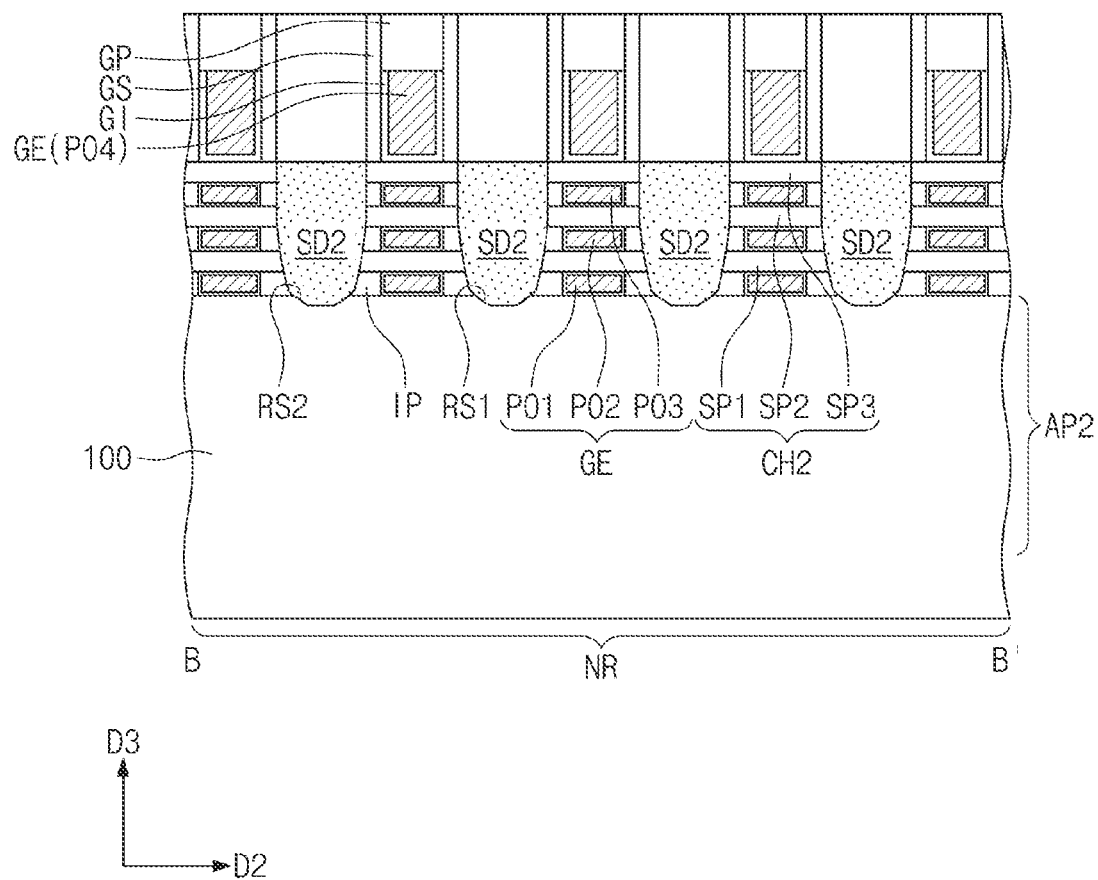
Figure 10C:
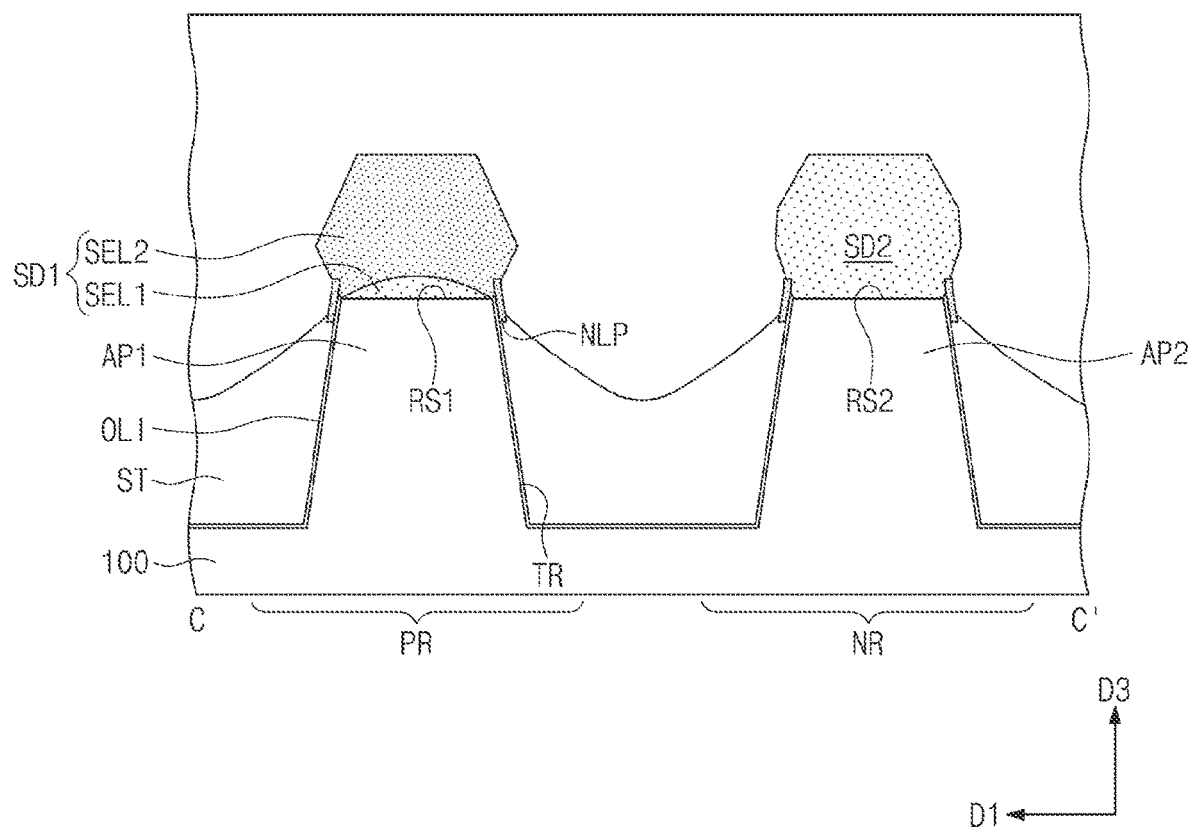
Figure 10D:
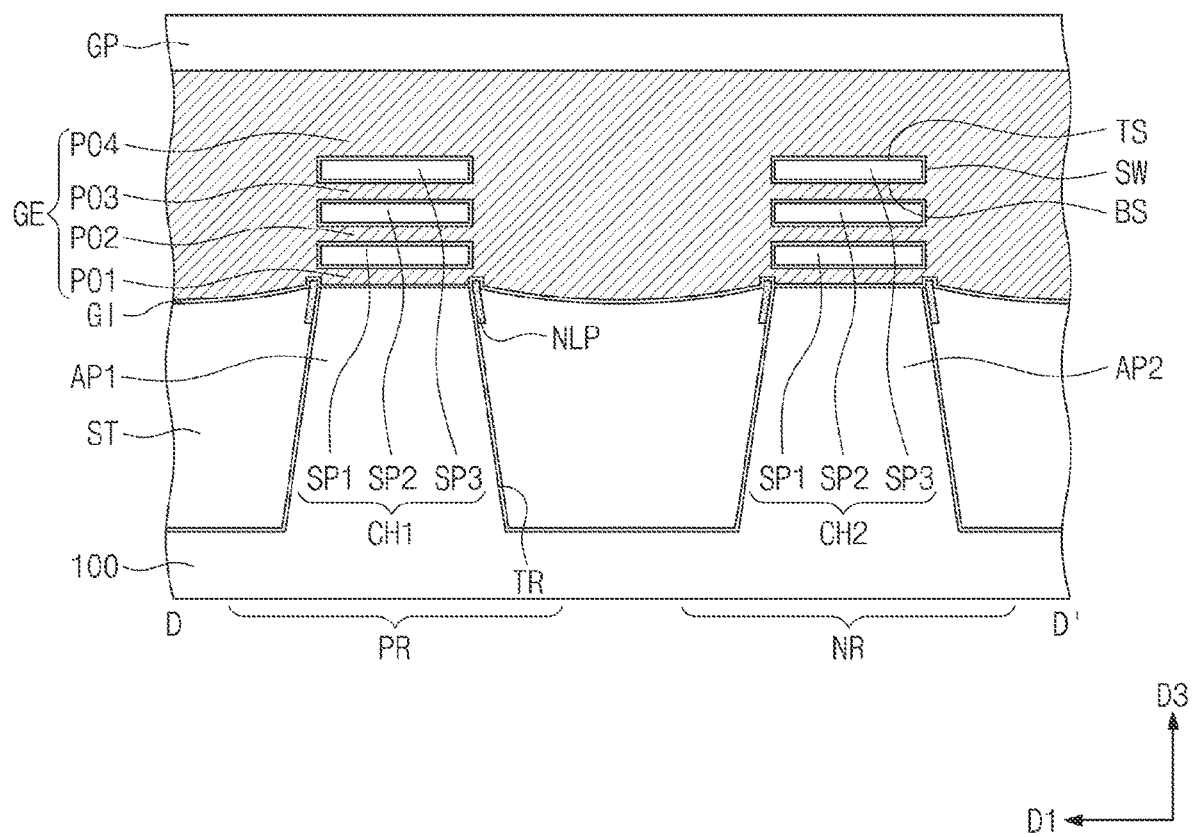

The sacrificial layers SAL exposed to the first empty spaces ET1 may be selectively removed to form second empty spaces ET2 (see FIG. 9D). For example, an etching process that selectively etches the sacrificial layers SAL may be performed such that the sacrificial layers SAL may be removed, and such that the first, second, and third semiconductor patterns SP1, SP2, and SP3 may remain.

The etching process may have a high etch rate for silicon-germanium whose germanium concentration is relatively high. For example, the etching process may have a high etch rate for silicon-germanium whose germanium concentration is greater than about 10 at %.

During the etching process, the sacrificial layers SAL may be removed from the PMOSFET region PR and the NMOSFET region NR. The etching process may include a wet etching process. An etching material used for the etching process may promptly etch the sacrificial layer SAL whose germanium concentration is relatively high. During the etching process, the first source/drain pattern SD1 on the PMOSFET region PR may be protected by the first semiconductor layer SEL1 whose germanium concentration is relatively low.

Referring to FIG. 9D, as the sacrificial layers SAL are selectively removed, the stacked first, second, and third semiconductor patterns SP1, SP2, and SP3 may remain on each of the first and second active patterns AP1 and AP2. Second empty spaces ET2 may be formed in corresponding areas from which the sacrificial layers SAL are removed. The second empty spaces ET2 may be defined between the first, second, and third semiconductor patterns SP1, SP2, and SP3.

Referring to FIGS. 10A to 10D, a gate dielectric layer GI may be conformally formed in the first and second empty spaces ET1 and ET2. A gate electrode GE may be formed on the gate dielectric layer GI. The gate electrode GE may be formed to fill the first and second empty spaces ET1 and ET2. For example, the gate electrode GE may include first, second, and third parts PO1, PO2, and PO3 that fill the second empty spaces ET2. The gate electrode GE may further include a fourth part PO4 that fills the first empty space ET1. A gate capping pattern GP may be formed on the gate electrode GE.

Referring back to FIGS. 1 and 2A to 2D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to be electrically connected to the first and second source/drain patterns SD1 and SD2. A gate contact GC may be formed to penetrate the second interlayer dielectric layer 120 and the gate capping pattern GP and to be electrically connected to the gate electrode GE.

A pair of separation structures DB may be formed on opposite sides of a logic cell LC. The separation structure DB may extend from the second interlayer dielectric layer 120 through the gate electrode GE into the active pattern AP1 or AP2. The separation structure DB may include a dielectric material such as, for example, a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 11:
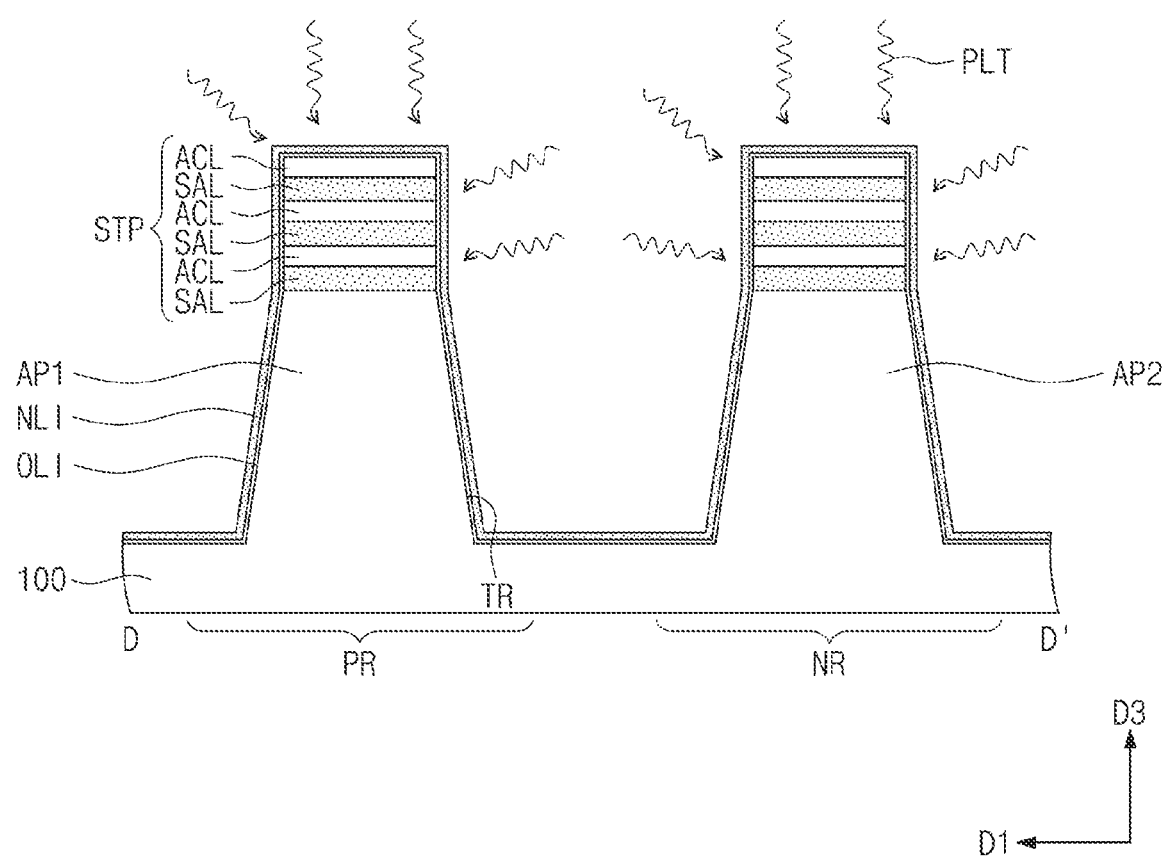
FIGS. 11 to 13 illustrate cross-sectional views take along line D-D' of FIG. 1, showing a method of forming a passivation layer and a device isolation layer, according to some embodiments of the present inventive concept.
Figure 12:
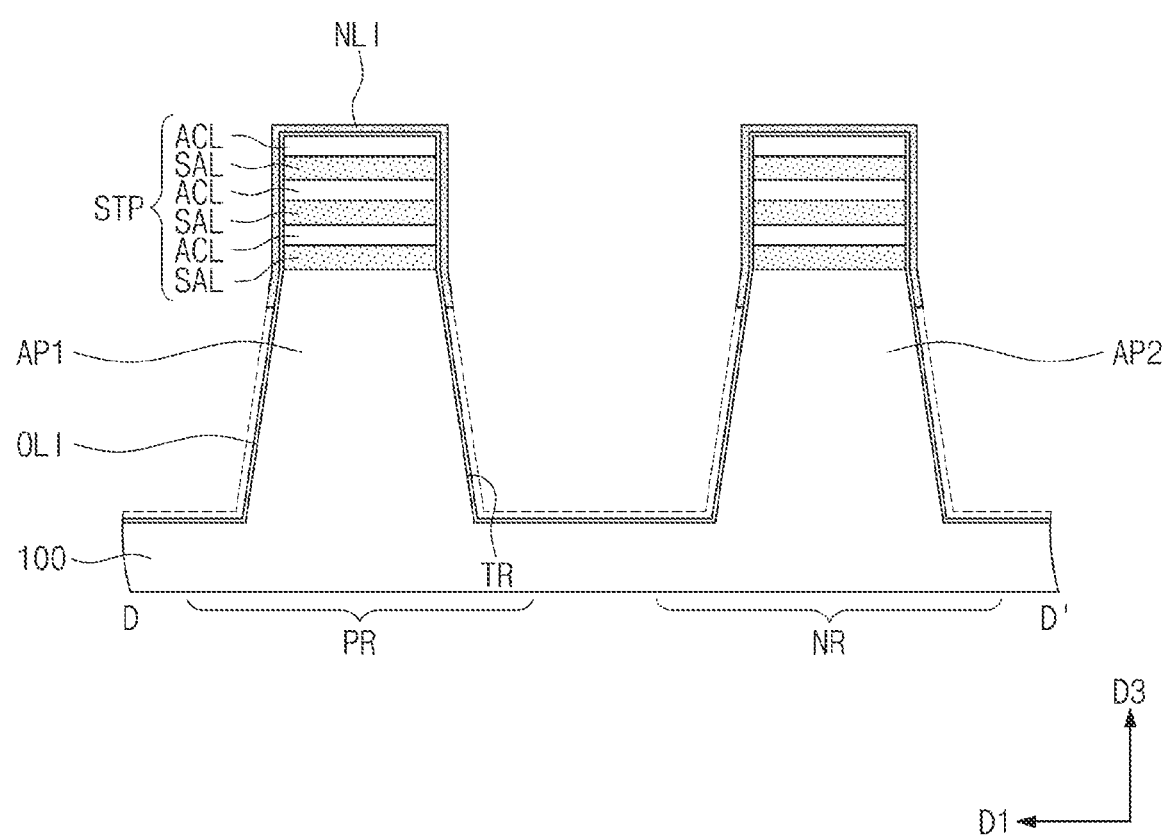
Figure 13:
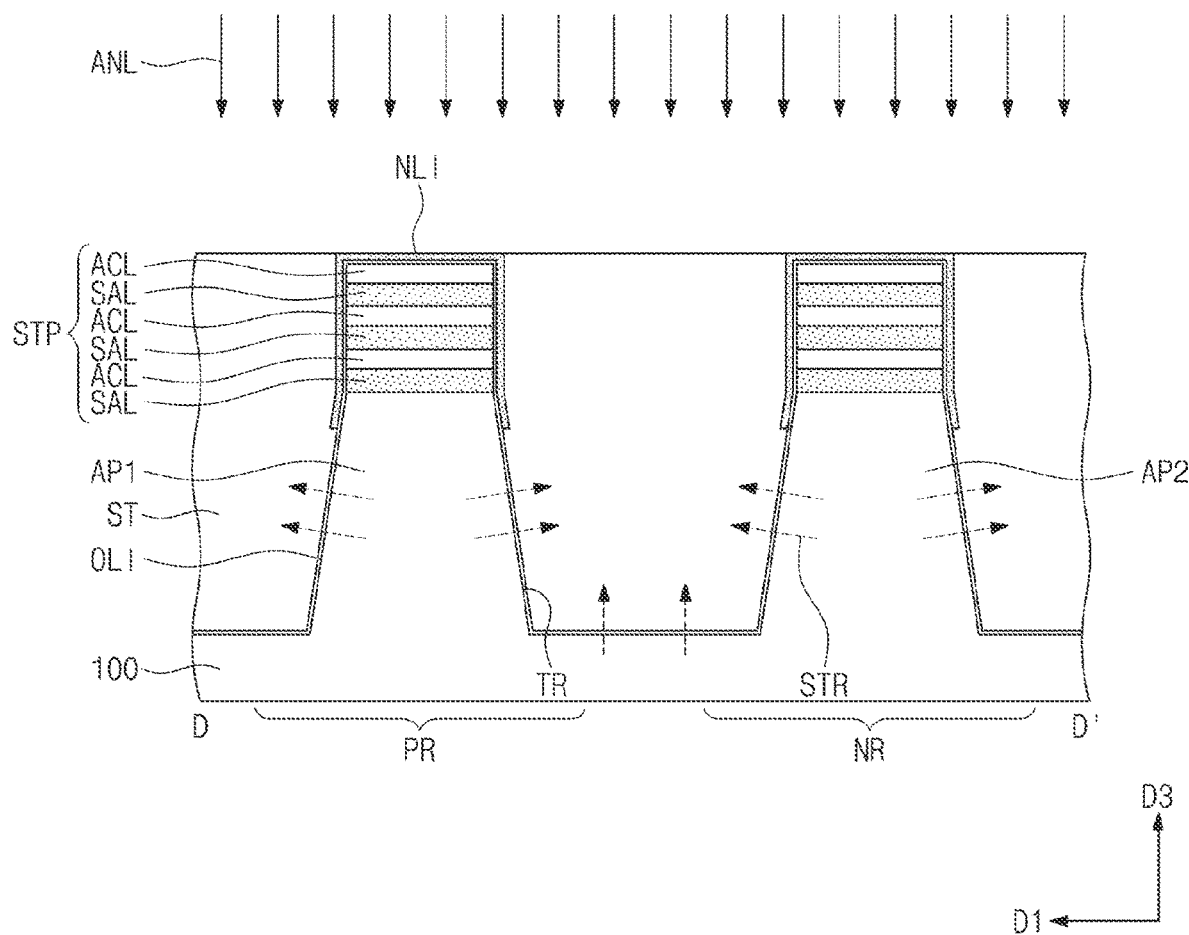

FIGS. 11 to 13 illustrate cross-sectional views take along line D-D' of FIG. 1, showing a method of forming a passivation layer and a device isolation layer, according to some embodiments of the present inventive concept.

Referring to FIG. 11, after the liner layer OLI is formed on the first and second active patterns AP1 and AP2, the passivation layer NLI may be conformally formed on an entire surface of the substrate 100. The passivation layer NLI may all cover the first and second active patterns AP1 and AP2 and the stack patterns STP.

A plasma treatment process PLT may be performed only on an upper portion of the passivation layer NLI or on the passivation layer NLI on the stack patterns STP. The passivation layer NLI may have greater etch resistance at its upper portion on which the plasma treatment process PLT is performed than at its lower portion on which the plasma treatment process PLT is not performed. For example, the plasma treatment process PLT may cause the passivation layer NLI on the stack pattern STP to have an etch selectivity with respect to the passivation layer NLI in the trench TR.

Referring to FIG. 12, the passivation layer NLI disposed in the trench TR may be selectively etched and removed due to an etch selectivity between the passivation layer NLI disposed on the stack pattern STP and the passivation layer NLI disposed in the trench TR. For example, the passivation layer NLI may selectively remain only on the stack pattern STP. Therefore, the passivation layer NLI may be formed as shaped in FIG. 4B.

Referring to FIG. 13, a dielectric layer may be formed on the entire surface of the substrate 100, and may then be planarized to form the device isolation layer ST. A heat treatment process ANL may be performed on the device isolation layer ST.

During the heat treatment process ANL, the first and second active patterns AP1 and AP2 not covered with the passivation layer NLI may apply a stress STR to the device isolation layer ST in the trench TR. Therefore, the device isolation layer ST in the trench TR may become more densified and rigid. During the heat treatment process ANL, the stack pattern STP may be protected by the passivation layer NLI, and thus may be prevented from being deformed.

Figure 14:
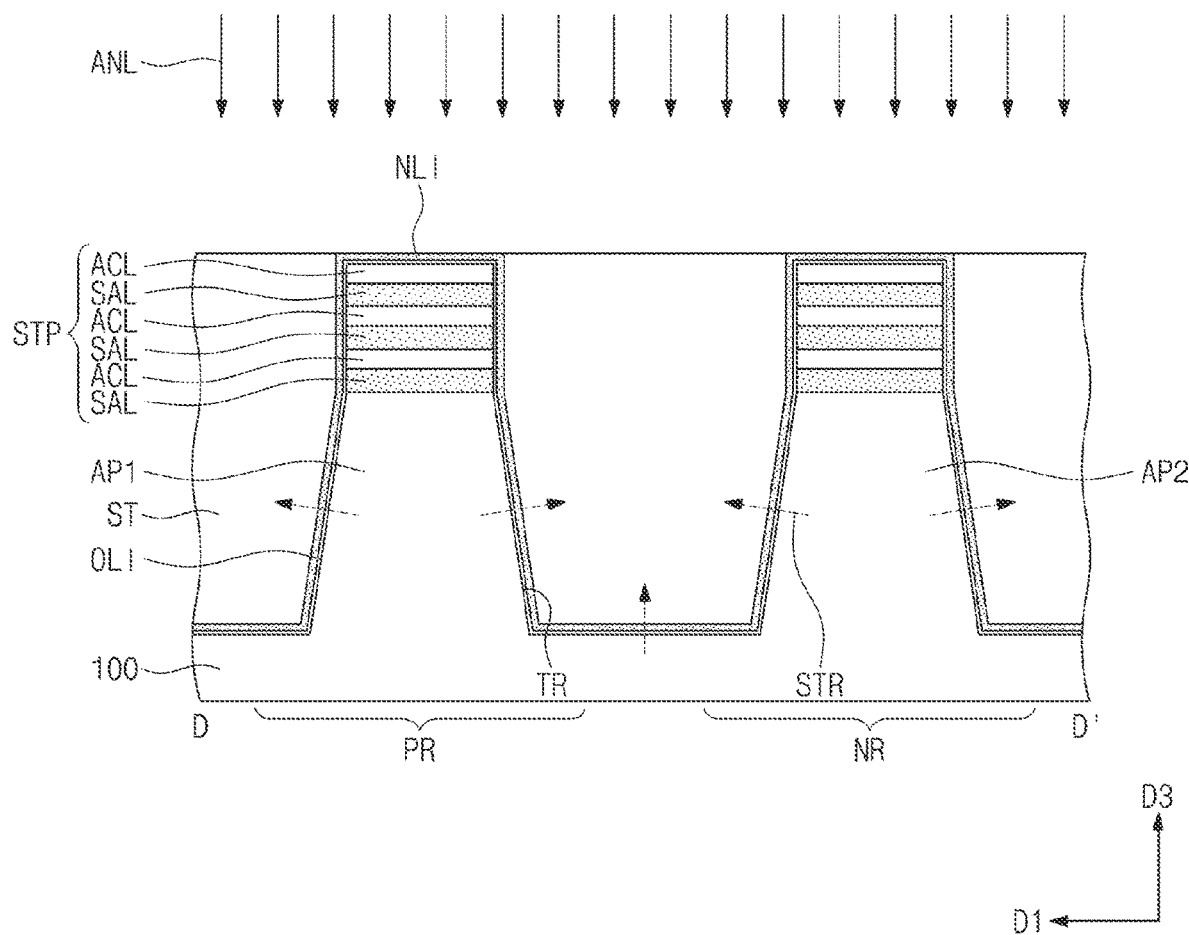
FIGS. 14 and 15 illustrate cross-sectional views taken along line D-D' of FIG. 1, showing a method of forming a passivation layer and a device isolation layer, according to a comparative example.
Figure 15:
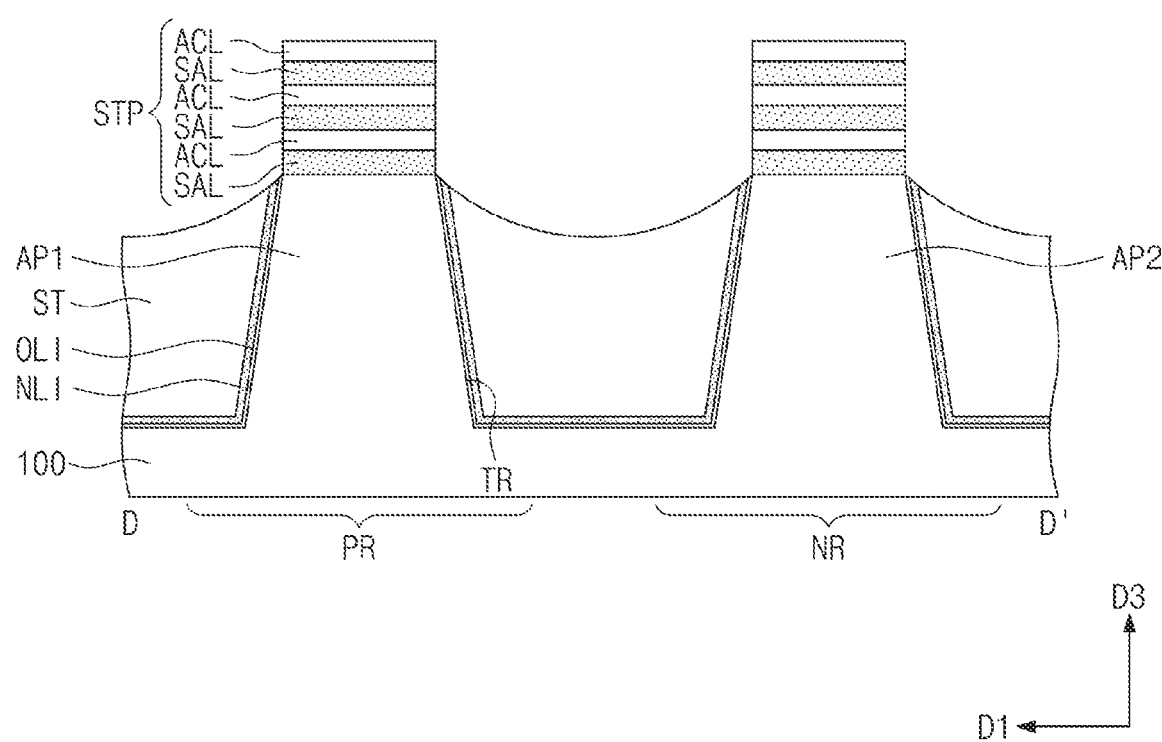

FIGS. 14 and 15 illustrate cross-sectional views taken along line D-D' of FIG. 1, showing a method of forming a passivation layer and a device isolation layer, according to a comparative example.

In some embodiments of the present inventive concept, the lower portion of the passivation layer NLI may be selectively removed as described above with reference to FIGS. 11 and 12. In contrast, referring to FIG. 14, in a comparative example, the passivation layer NLI may not be removed, and the device isolation layer ST may be formed on the passivation layer NLI. In this case, during the heat treatment process ANL, the passivation layer NLI may not sufficiently apply the stress STR to the device isolation layer ST in the trench TR. As a result, the device isolation layer ST in the trench TR may be relatively less densified and rigid.

Referring to FIG. 15, the device isolation layer ST of FIG. 14 may be recessed to expose the stack patterns STP. In the comparative example, because the device isolation layer ST in the trench TR is relatively less rigid, the top surface of the device isolation layer ST may be excessively over-etched and recessed. This may increase a volume of the gate electrode GE formed on the device isolation layer ST, and as a result, electrical characteristics may deteriorate.

Figure 16:
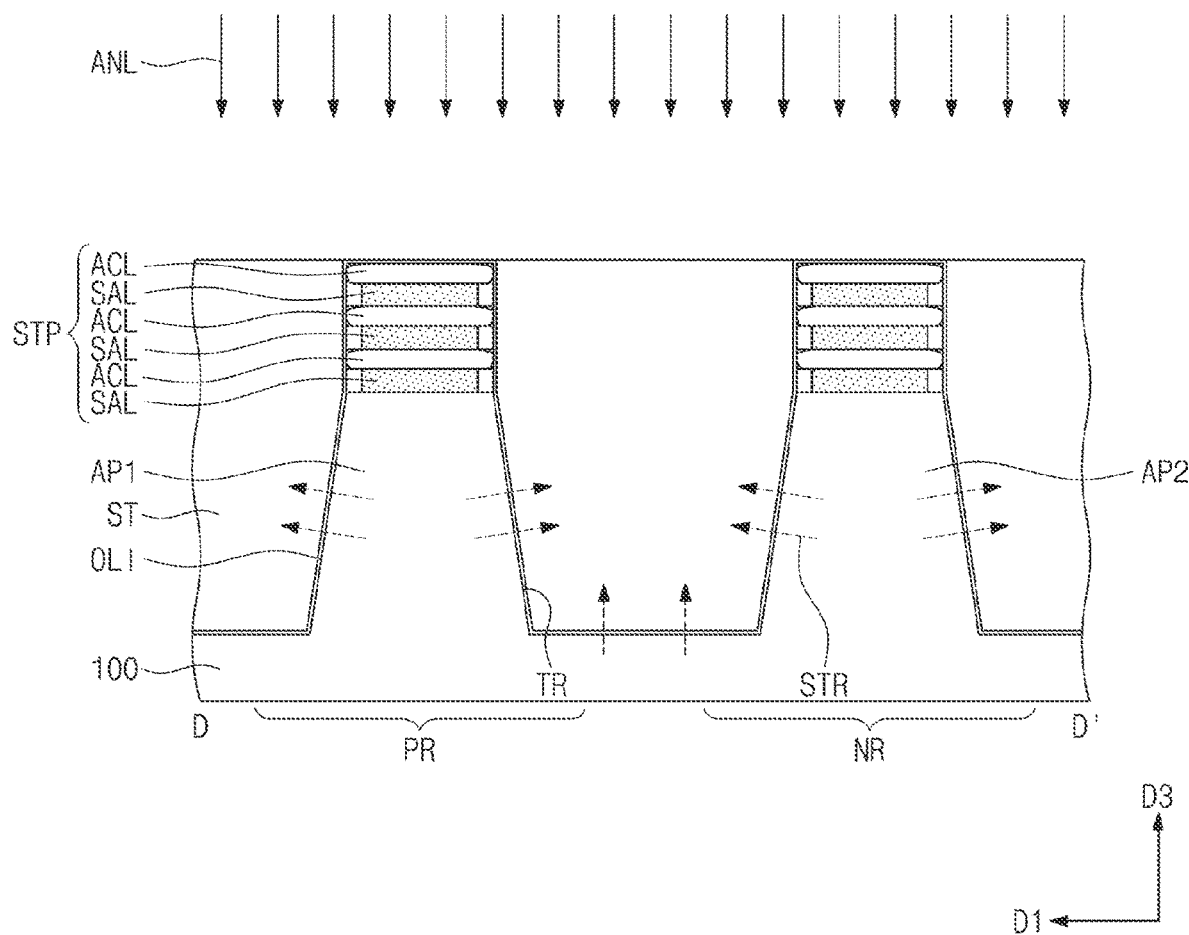
FIG. 16 illustrates a cross-sectional view taken along line D-D' of FIG. 1, showing a method of forming a passivation layer and a device isolation layer, according to another comparative example.

FIG. 16 illustrates a cross-sectional view taken along line D-D' of FIG. 1, showing a method of forming a passivation layer and a device isolation layer, according to another comparative example.

Referring to FIG. 16, the passivation layer NLI according an embodiment of the inventive concept is omitted in the comparative example, and the device isolation layer ST may be formed on the liner layer OLI. In this case, during the heat treatment process ANL, the stress STR may be sufficiently applied to the device isolation layer ST in the trench TR. However, the passivation layer NLI may not protect the stack patterns STP, and thus, the sacrificial layers SAL and the active layers ACL may be deformed during the heat treatment process ANL. For example, the heat treatment process ANL may contract the sacrificial layer SAL. In addition, the heat treatment process ANL may change a shape of the active layer ACL.

The stack pattern STP may be used as the channel pattern CH1 or CH2 and the gate electrode GE in subsequent processes, and thus, deformation may occur, which may impose negative effects on electrical characteristics and reliability of final semiconductor devices.

Referring back to FIG. 13, according to an embodiment of the inventive concept, the passivation layer NLI may be selectively formed only on the stack pattern STP, and thus, the stack pattern STP may be prevented from being deformed during the heat treatment process ANL. In addition, according to an embodiment of the inventive concept, the passivation layer NLI may be omitted in the trench TR, and therefore, the stress STR may be sufficiently applied to the device isolation layer ST in the trench TR. As a result, an embodiment of the inventive concept may prevent the problem described above with reference to the comparative examples, and may increase reliability and electrical characteristics of semiconductor devices.

Figure 17:
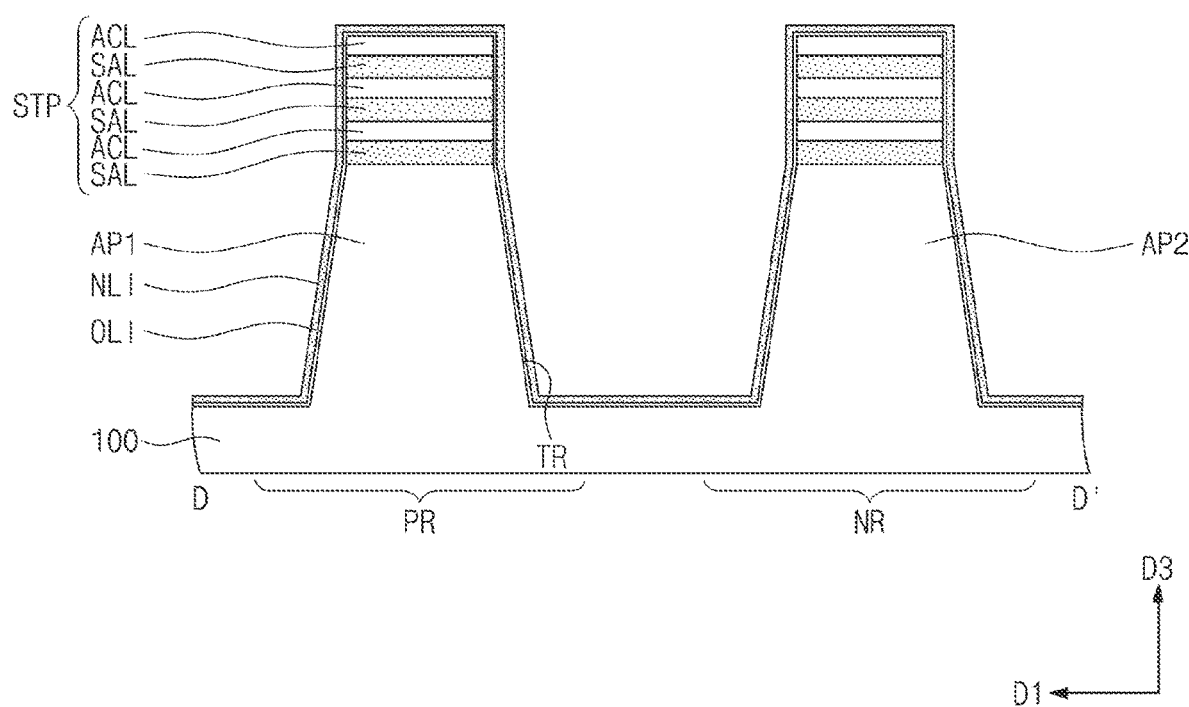
FIGS. 17 and 18 illustrate cross-sectional views take along line D-D' of FIG. 1, showing a method of forming a passivation layer, according to some embodiments of the present inventive concept.
Figure 18:
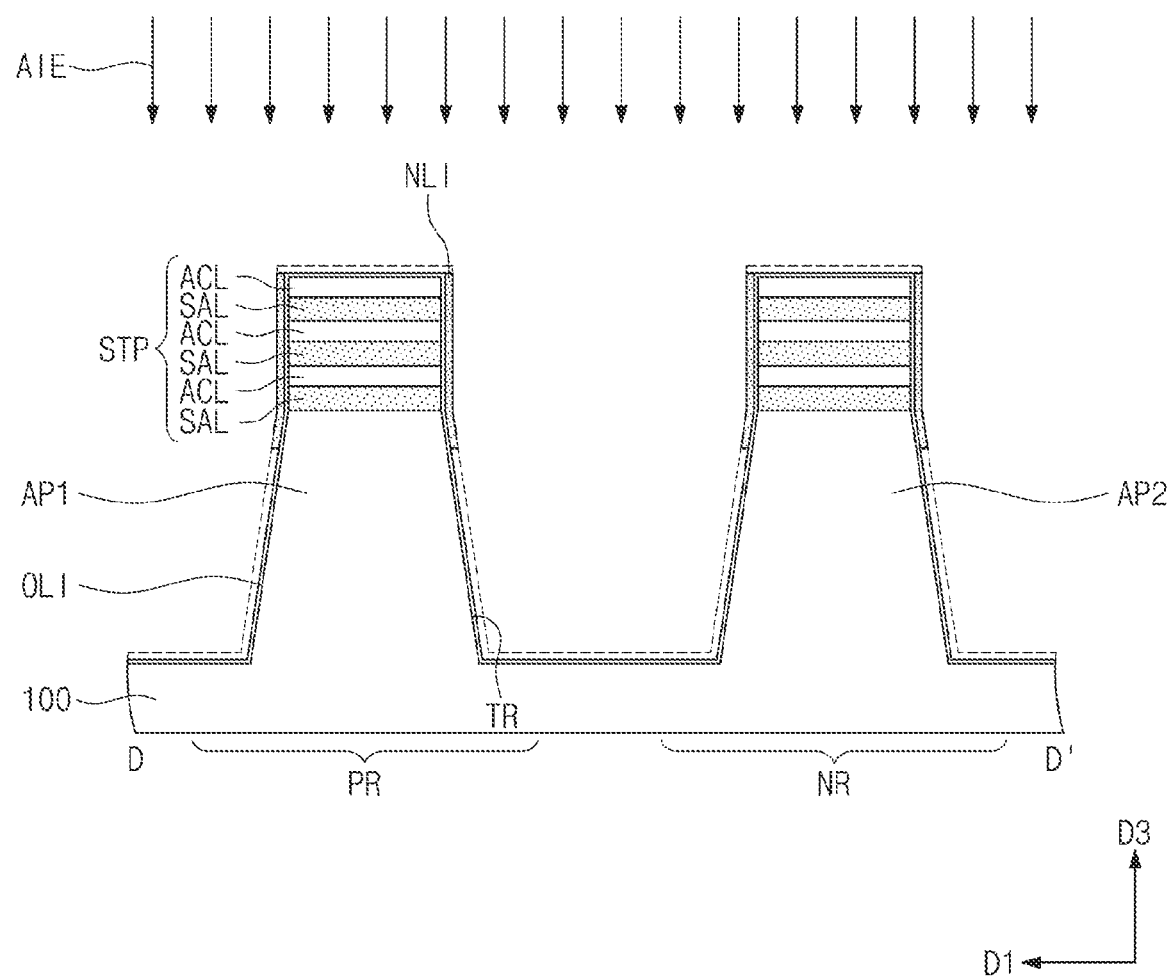

FIGS. 17 and 18 illustrate cross-sectional views take along line D-D' of FIG. 1, showing a method of forming a passivation layer, according to some embodiments of the present inventive concept.

Referring to FIG. 17, after the liner layer OLI is formed on the first and second active patterns AP1 and AP2, the passivation layer NLI may be conformally formed on an entire surface of the substrate 100. The passivation layer NLI may cover all of the first and second active patterns AP1 and AP2 and the stack patterns STP. The plasma treatment process PLT described above with reference to FIG. 11 may be omitted in an embodiment according to FIG. 17.

Referring to FIG. 18, the passivation layer NLI may undergo an anisotropic etching process AIE in which the passivation layer NLI is selectively etched. The trench TR may have a sidewall inclination gentler than that of the stack pattern STP. Therefore, the passivation layer NLI disposed on a sidewall of the stack pattern STP may not be etched during the anisotropic etching process. A selective removal may be performed on the passivation layer NLI on a top surface of the stack pattern STP and the passivation layer NLI in the trench TR. As a result, the passivation layer NLI may remain on the sidewalls of the stack patterns STP, which may thereby protect the stack patterns STP during the heat treatment process ANL described above.

Figure 19:
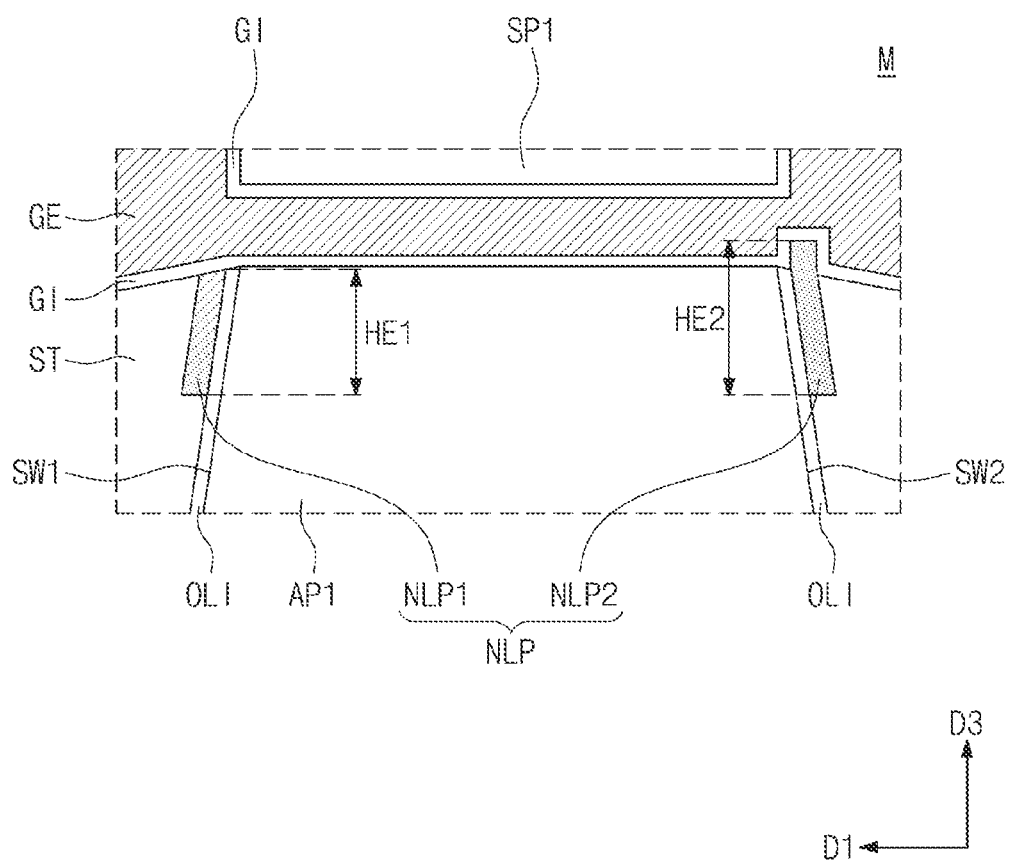
FIGS. 19 and 20 illustrate enlarged cross-sectional views of section M depicted in FIG. 2D, showing a semiconductor device, according to some embodiments of the present inventive concept.
Figure 20:
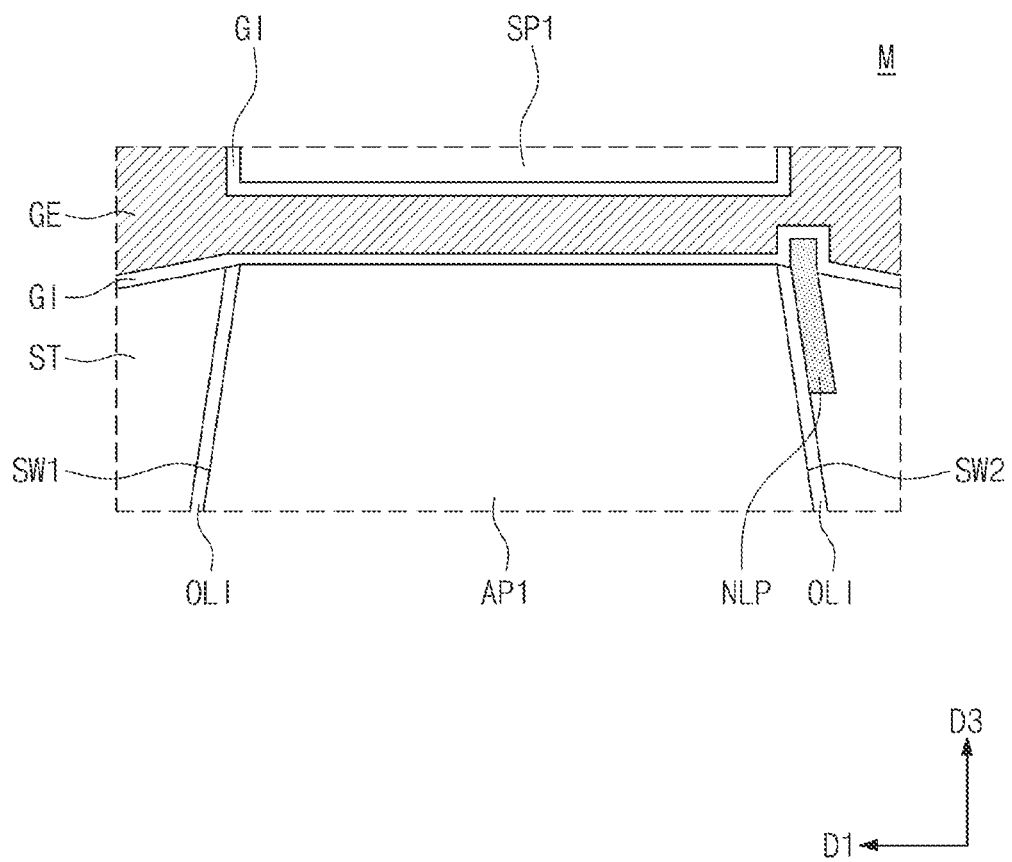

FIGS. 19 and 20 illustrate enlarged cross-sectional views of section M depicted in FIG. 2D, showing a semiconductor device, according to some embodiments of the present inventive concept. For convenience of explanation, in the following description, a detailed description of technical features and components previously described with reference to FIGS. 1, 2A to 2D, and 3 will be omitted, and the description will focus on differences thereof.

Referring to FIG. 19, the first passivation pattern NLP1 disposed on the first sidewall SW1 of the first active pattern AP1 may have a different size from that of the second passivation pattern NLP2 disposed on the second sidewall SW2 of the first active pattern AP1. For example, an upper part of the first passivation pattern NLP1 may be omitted. Hence, the first height HE1 of the first passivation pattern NLP1 may be less than the second height HE2 of the second passivation pattern NLP2.

Referring to FIG. 20, the passivation pattern NLP may be selectively provided only on the second sidewall SW2 of the first active pattern AP1. For example, the passivation pattern NLP may be omitted on the first sidewall SW1 of the first active pattern AP1.

Figure 21:
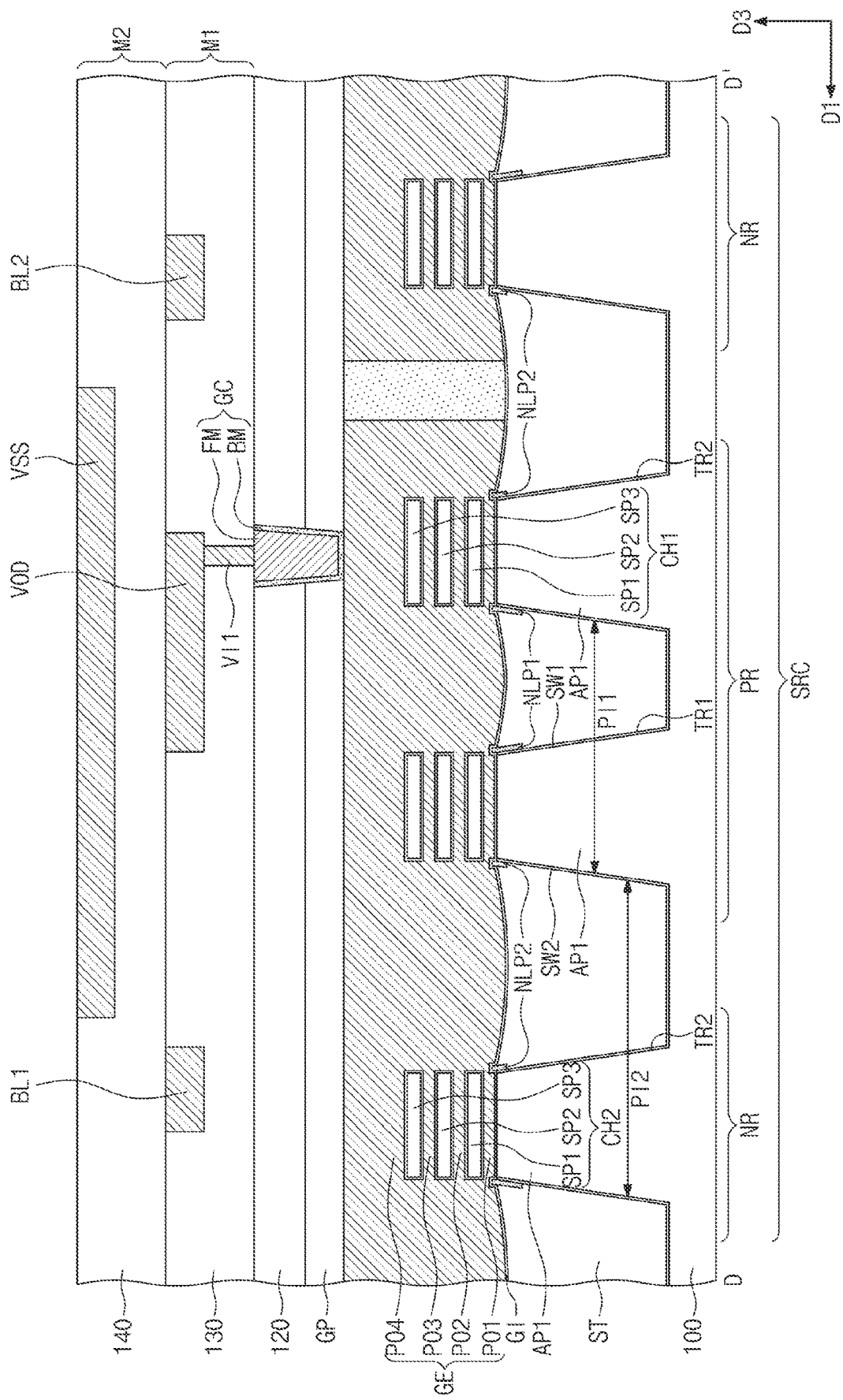
FIGS. 21 and 22 illustrate cross-sectional views showing a semiconductor device according to some embodiments of the present inventive concept.
Figure 22:
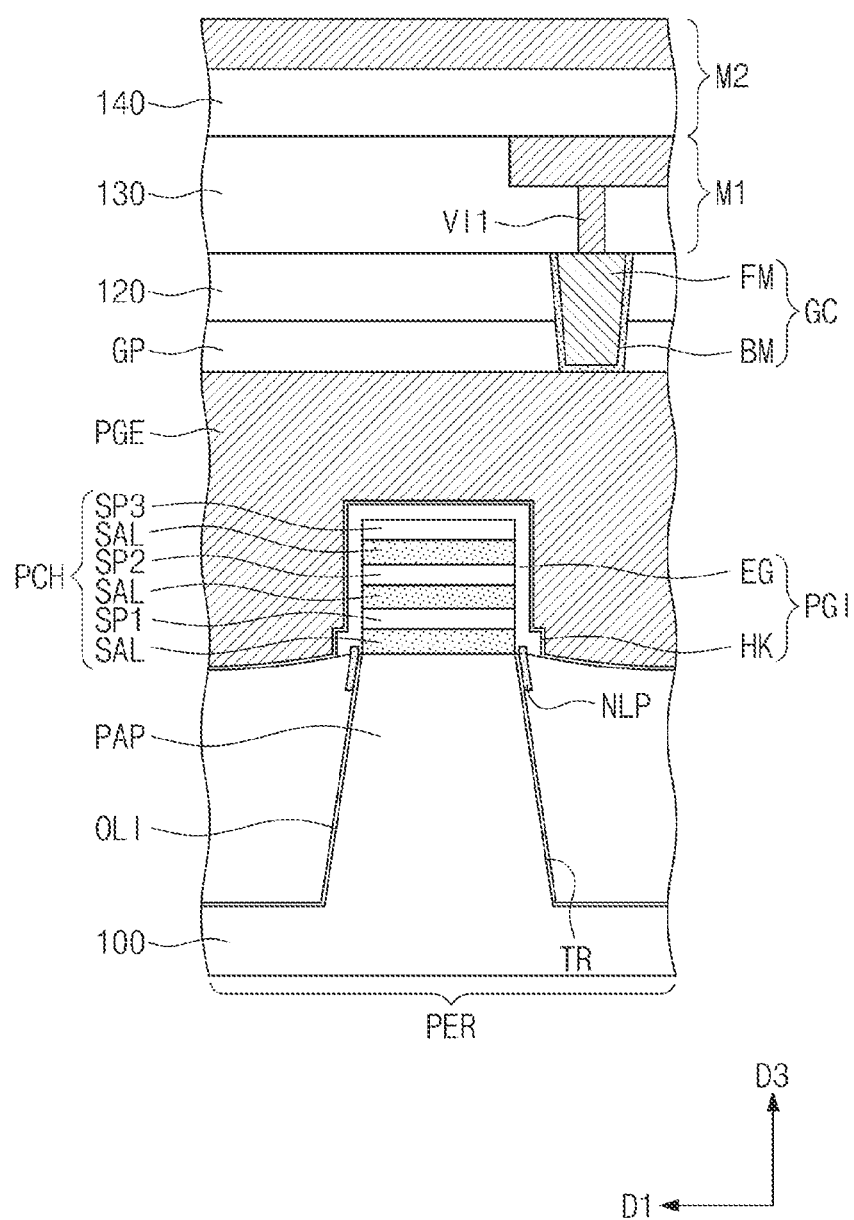

FIGS. 21 and 22 illustrate cross-sectional views showing a semiconductor device according to some embodiments of the present inventive concept. For convenience of explanation, in the following description, a detailed description of technical features and components previously described with reference to FIGS. 1, 2A to 2D, and 3 will be omitted, and the description will focus on differences thereof.

Referring to FIG. 21, an SRAM cell SRC may be provided on a substrate 100. Memory transistors may be provided on the SRAM cell SRC. For example, the SRAM cell SRC may be 6T-SRAM. The SRAM cell SRC may include a PMOSFET region PR and NMOSFET regions NR.

A pair of first active patterns AP1 may be provided on the PMOSFET region PR. A second active pattern AP2 may be provided on each of the NMOSFET regions NR. A first trench TR1 may be defined between the first active patterns AP1. A second trench TR2 may be defined between the first active pattern AP1 and the second active pattern AP2 adjacent to the first active pattern AP1. The first trench TR1 may have a width greater than that of the second trench TR2.

A pair of first active patterns AP1 may have a first pitch PI1 therebetween, and the first active pattern AP1 and its adjacent second active pattern AP2 may have a second pitch PI2 therebetween. The first pitch PI1 and the second pitch PI2 may be different from each other. For example, the second pitch PI2 may be greater than the first pitch PI1.

A first passivation pattern NLP1 may be provided on an upper sidewall of the first trench TR1, and a second passivation pattern NLP2 may be provided on an upper sidewall of the second trench TR2. For example, the first active pattern AP1 may include a first sidewall SW1 and a second sidewall SW2 that are opposite to each other. The first sidewall SW1 may be adjacent to another first active pattern AP1, and the second sidewall SW2 may be adjacent to the second active pattern AP2. The first passivation pattern NLP1 may be interposed between the first sidewall SW1 and the device isolation layer ST, and the second passivation pattern NLP2 may be interposed between the second sidewall SW2 and the device isolation layer ST.

The first passivation pattern NLP1 may have a size different from that of the second passivation pattern NLP2. For example, according to an embodiment of the present inventive concept, the size of the first passivation pattern NLP1 may be greater than that of the second passivation pattern NLP2. However, embodiments of the present inventive concept are not limited thereto. For example, according to an embodiment of the present inventive concept, the size of the first passivation pattern NLP1 may be less than that of the second passivation pattern NLP2.

The sizes of the first and second passivation patterns NLP1 and NLP2 may be changed depending on a width of the first trench TR1 in which the first passivation pattern NLP1 is disposed and on a width of the second trench TR2 in which the second passivation pattern NLP2 is disposed. For example, the sizes of the first and second passivation patterns NLP1 and NLP2 may depend on a pitch between neighboring active patterns AP1 and/or AP2.

In an embodiment, as described above with reference to FIG. 20, one or both of the first and second passivation patterns NLP1 and NLP2 may be omitted. For example, the presence of the first and second passivation patterns NLP1 and NLP2 may depend on the pitch between neighboring active patterns AP1 and/or AP2.

A first metal layer M1 disposed on the SRAM cell SRC may include a first bit line BL1, a second bit line BL2, and a power line VDD. A second metal layer M2 disposed on the SRAM cell SRC may include a ground line VSS.

Referring to FIG. 22, a semiconductor device according to an embodiment of the present inventive concept may include a substrate 100 including a peripheral region PER. The peripheral region PER may be an area in which transistors that constitute a process core or an input/out terminal are disposed. A transistor disposed in the peripheral region PER may operate at a higher power than that required for operating a transistor disposed on the logic cell LC described above.

A pair of peripheral active patterns PAP may be provided in the peripheral region PER. A peripheral channel pattern PCH may be provided on the peripheral active pattern PAP. The peripheral active pattern PAP may include first, second, and third semiconductor patterns SP1, SP2, and SP3 that are stacked. The peripheral active pattern PAP may further include sacrificial layers SAL interposed between the first, second, and third semiconductor patterns SP1, SP2, and SP3. For example, unlike a transistor disposed on the logic cell LC, a transistor disposed in the peripheral region PER may be configured such that the sacrificial layers SAL are not removed, but rather, remain.

A passivation pattern NLP may be interposed between the device isolation layer ST and an upper sidewall of the peripheral active pattern PAP. The passivation pattern NLP disposed in the peripheral region PER may have a size the same as or different from that of the passivation pattern NLP disposed on the logic cell LC described above. A description of the passivation pattern NLP disposed in the peripheral region PER may be the same as that of the passivation pattern NLP disposed on the logic cell LC described above.

A peripheral gate electrode PGE may be provided on the peripheral channel pattern PCH. A peripheral gate dielectric layer PGI may be interposed between the peripheral channel pattern PCH and the peripheral gate electrode PGE. The peripheral gate dielectric layer PGI may include a dielectric layer EG that directly contacts and covers a top surface and opposite sidewalls of the peripheral channel pattern PCH. The peripheral gate dielectric layer PGI may further include a high-k dielectric layer HK disposed on the dielectric layer EG. The dielectric layer EG may be thicker than the high-k dielectric layer HK. The dielectric layer EG may include a silicon oxide layer or a silicon oxynitride layer. The high-k dielectric layer HK may include a high-k dielectric material.

The dielectric layer EG may cover an upper part of the passivation pattern NLP, in which upper part protrudes upwardly from the device isolation layer ST. For example, the dielectric layer EG may directly contact and cover a top surface and opposite sidewalls of the upper part of the passivation pattern NLP.

A semiconductor device according to embodiments of the present inventive concept may prevent a top surface of a device isolation layer from being excessively recessed, which could deteriorate electrical characteristics of the semiconductor device. Moreover, according to embodiments of the present inventive concept, channels and gate electrodes may be stably formed, and as a result, reliability and electrical characteristics of the semiconductor device may be increased.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   a first active pattern disposed on a substrate;
   a device isolation layer that fills a trench which defines the first active pattern;
   a first channel pattern and a first source/drain pattern disposed on the first active pattern, the first channel pattern including a plurality of semiconductor patterns that are stacked and spaced apart from each other;
   a gate electrode that extends and runs across the first channel pattern;
   a gate dielectric layer disposed between the first channel pattern and the gate electrode; and
   a first passivation pattern disposed between the device isolation layer and a first sidewall of the first active pattern,
   wherein the first passivation pattern includes:
      an upper part that protrudes upwardly from the device isolation layer; and
      a lower part that is buried in the device isolation layer,
   wherein the gate dielectric layer covers the upper part of the first passivation pattern.

2. The semiconductor device of claim 1, wherein a top surface of the upper part of the first passivation pattern is higher than a top surface of the first active pattern,
   wherein the top surface of the upper part of the first passivation pattern is lower than a bottom surface of a lowermost one of the semiconductor patterns.

3. The semiconductor device of claim 1, further comprising:
   a second passivation pattern disposed between the device isolation layer and a second sidewall of the first active pattern, the second sidewall being opposite to the first sidewall,
   wherein a size of the first passivation pattern is different from a size of the second passivation pattern.

4. The semiconductor device of claim 1, wherein neither the first passivation pattern nor an additional passivation pattern is disposed between the device isolation layer and a second sidewall of the first active pattern, the second sidewall being opposite to the first sidewall.

5. The semiconductor device of claim 1, further comprising:
   a second active pattern and a third active pattern disposed on the substrate,
   wherein the first to third active patterns are sequentially arranged along a first direction, and a first pitch between the first and second active patterns is different from a second pitch between the second and third active patterns; and a second passivation pattern disposed between the device isolation layer and a sidewall of the second active pattern, wherein the first sidewall of the first active pattern faces the second active pattern, wherein the sidewall of the second active pattern faces the third active pattern, and wherein a size of the first passivation pattern is different from a size of the second passivation pattern.

6. The semiconductor device of claim 1, further comprising a liner layer disposed between the first passivation pattern and the first sidewall of the first active pattern, wherein the first passivation pattern includes SiOC, SiN, SiC, AlO, $TiO_2$, or a combination thereof, and wherein the liner layer includes a silicon oxide layer.

7. The semiconductor device of claim 1, wherein the gate dielectric layer directly contacts and covers a top surface and opposite sidewalls of the upper part.

8. The semiconductor device of claim 1, wherein the first passivation pattern is further disposed between the first source/drain pattern and the device isolation layer.

9. The semiconductor device of claim 1, wherein the semiconductor patterns include a first semiconductor pattern, a second semiconductor pattern, and a third semiconductor pattern that are sequentially stacked, wherein the gate electrode includes:

a first part disposed between the first active pattern and the first semiconductor pattern;

a second part disposed between the first semiconductor pattern and the second semiconductor pattern;

a third part disposed between the second semiconductor pattern and the third semiconductor pattern; and a fourth part disposed on the third semiconductor pattern.

10. The semiconductor device of claim 1, wherein the gate electrode surrounds a top surface, a bottom surface, and opposite sidewalls of each of the semiconductor patterns.

11. A semiconductor device, comprising:

a first active pattern disposed on a substrate;

a device isolation layer that fills a trench which defines the first active pattern;

a first channel pattern and a first source/drain pattern disposed on the first active pattern, the first channel pattern including a plurality of semiconductor patterns that are stacked and spaced apart from each other;

a gate electrode that extends and runs across the first channel pattern;

a gate dielectric layer disposed between the first channel pattern and the gate electrode;

a first passivation pattern disposed between the device isolation layer and a first sidewall of the first active pattern; and a second passivation pattern disposed between the device isolation layer and a second sidewall of the first active pattern, the second sidewall being opposite to the first sidewall, wherein a size of the first passivation pattern is different from a size of the second passivation pattern.

12. The semiconductor device of claim 11, wherein the first passivation pattern includes:

an upper part that protrudes upwardly from the device isolation layer; and a lower part that is buried in the device isolation layer, wherein a top surface of the upper part of the first passivation pattern is higher than a top surface of the first active pattern, wherein the top surface of the upper part of the first passivation pattern is lower than a bottom surface of a lowermost one of the semiconductor patterns.

13. The semiconductor device of claim 12, wherein the gate dielectric layer covers the upper part of the first passivation pattern.

14. The semiconductor device of claim 11, further comprising:

a second active pattern and a third active pattern disposed on the substrate, wherein the first active pattern is disposed between the second active pattern and the third active pattern, and wherein a first pitch between the first active pattern and the second active pattern is different from a second pitch between the first active pattern and the third active pattern.

15. The semiconductor device of claim 11, further comprising:

a plurality of liner layers disposed between the first and second sidewalls of the first active pattern and the first and second passivation patterns, wherein the first and second passivation patterns include SiOC, SiN, SiC, AlO, $TiO_2$, or a combination thereof, and wherein the liner layers include a silicon oxide layer.

16. A semiconductor device, comprising:

a first active pattern disposed on a substrate;

a device isolation layer that fills a trench which defines the first active pattern;

a first passivation pattern disposed between the device isolation layer and a first sidewall of the first active pattern;

a first source/drain pattern disposed on the first active pattern and a first channel pattern connected to the first source/drain pattern, the first channel pattern including a first semiconductor pattern, a second semiconductor pattern, and a third semiconductor pattern that are sequentially stacked and spaced apart from each other;

a gate electrode that runs across the first channel pattern and extends in a first direction, the gate electrode including a first part disposed between the first active pattern and the first semiconductor pattern, a second part disposed between the first semiconductor pattern and the second semiconductor pattern, a third part disposed between the second semiconductor pattern and the third semiconductor pattern, and a fourth part disposed on the third semiconductor pattern;

a gate dielectric layer disposed between the first channel pattern and the gate electrode;

a plurality of gate spacers disposed on opposite sidewalls of the fourth part of the gate electrode;

a gate capping pattern disposed on a top surface of the gate electrode;

a first interlayer dielectric layer disposed on the gate capping pattern;

an active contact that penetrates the first interlayer dielectric layer and is coupled to the first source/drain pattern;

a gate contact that penetrates the first interlayer dielectric layer and is coupled to the gate electrode;

a second interlayer dielectric layer disposed on the first interlayer dielectric layer;

a first metal layer disposed in the second interlayer dielectric layer, the first metal layer including a plurality of first lines electrically connected to the active contact and the gate contact;

a third interlayer dielectric layer disposed on the second interlayer dielectric layer; and a second metal layer disposed in the third interlayer dielectric layer, wherein the second metal layer includes a plurality of second lines electrically connected to corresponding first lines among the plurality of first lines, wherein the first passivation pattern includes:
an upper part that protrudes upwardly from the device isolation layer; and
a lower part that is buried in the device isolation layer, wherein the gate dielectric layer covers the upper part of the first passivation pattern.

17. The semiconductor device of claim 16, wherein a top surface of the upper part of the first passivation pattern is higher than a top surface of the first active pattern,
wherein the top surface of the upper part of the first passivation pattern is lower than a bottom surface of the first semiconductor pattern.

18. The semiconductor device of claim 16, further comprising:
a second passivation pattern disposed between the device isolation layer and a second sidewall of the first active pattern, the second sidewall being opposite to the first sidewall,
wherein a size of the first passivation pattern is different from a size of the second passivation pattern.

19. The semiconductor device of claim 16, further comprising:
a second active pattern and a third active pattern disposed on the substrate,
wherein the first to third active patterns are sequentially arranged along the first direction, and a first pitch between the first and second active patterns is different from a second pitch between the second and third active patterns; and
a second passivation pattern disposed between the device isolation layer and a sidewall of the second active pattern,
wherein the first sidewall of the first active pattern faces the second active pattern,
wherein the sidewall of the second active pattern faces the third active pattern, and
wherein a size of the first passivation pattern is different from a size of the second passivation pattern.

20. The semiconductor device of claim 16, further comprising:
a liner layer disposed between the first passivation pattern and the first sidewall of the first active pattern,
wherein the first passivation pattern includes SiOC, SiN, SiC, AlO, $TiO_2$, or a combination thereof, and
wherein the liner layer includes a silicon oxide layer.

* * * * *